US006455224B1

(12) United States Patent
Oohashi et al.

(10) Patent No.: US 6,455,224 B1
(45) Date of Patent: Sep. 24, 2002

(54) LITHOGRAPHIC PRINTING PLATE PRECURSOR

(75) Inventors: Hidekazu Oohashi; Sumiaki Yamasaki, both of Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/552,727

(22) Filed: Apr. 19, 2000

(30) Foreign Application Priority Data

Apr. 26, 1999 (JP) .......................................... 11-118295

(51) Int. Cl.$^7$ ................................................ G03F 7/004

(52) U.S. Cl. ..................... 430/270.1; 101/453; 430/302

(58) Field of Search .............................. 430/270.1, 302; 101/453, 463.1

(56) References Cited

U.S. PATENT DOCUMENTS

| | | | | | |
|---|---|---|---|---|---|
| 5,705,308 | A | | 1/1998 | West et al. | |
| 5,747,233 | A | * | 5/1998 | Lonsky et al. | 430/522 |
| 5,814,431 | A | * | 9/1998 | Nagasaka et al. | 430/281.1 |
| 5,985,514 | A | * | 11/1999 | Zheng et al. | 430/270.1 |
| 6,096,471 | A | * | 8/2000 | Kawamura et al. | 430/270.1 |
| 6,096,479 | A | * | 8/2000 | Van Damme et al. | 430/188 |
| 6,136,503 | A | * | 10/2000 | Zheng et al. | 430/270.1 |
| 6,153,352 | A | * | 11/2000 | Oohashi et al. | 430/270.1 |
| 6,159,657 | A | * | 12/2000 | Fleming et al. | 430/270.1 |
| 6,162,578 | A | * | 12/2000 | Zheng et al. | 430/278.1 |
| 6,165,691 | A | * | 12/2000 | Damme et al. | 430/303 |
| 6,190,830 | B1 | * | 2/2001 | Leon et al. | 430/270.1 |
| 6,190,831 | B1 | * | 2/2001 | Leon et al. | 430/270.1 |
| 6,242,155 | B1 | * | 6/2001 | Yamasaki et al. | 430/270.1 |
| 6,331,375 | B1 | * | 12/2001 | Kawamura et al. | 430/270.1 |
| 6,379,863 | B1 | * | 4/2002 | Oohashi et al. | 430/270.1 |

FOREIGN PATENT DOCUMENTS

| | | | | |
|---|---|---|---|---|
| EP | 288076 | A2 | * | 10/1988 |
| EP | 566103 | A1 | * | 10/1993 |
| EP | 652 483 | A1 | * | 5/1995 |
| EP | 784233 | A1 | * | 7/1997 |
| EP | 0 822 067 | A1 | | 2/1998 |
| EP | 0 867 769 | A1 | | 9/1998 |
| EP | 0 874 282 | A1 | | 10/1998 |
| EP | 0 924 102 | A1 | * | 6/1999 |

* cited by examiner

*Primary Examiner*—Rosemary Ashton
*Assistant Examiner*—Barbara Gilmore
(74) *Attorney, Agent, or Firm*—Burns, Doane, Swecker & Mathis, LLP

(57) ABSTRACT

A lithographic printing plate precursor is disclosed, comprising a support having thereon a photosensitive layer containing 6 wt % or more of an infrared absorbent which changes from hydrophilic to hydrophobic by heat, the support having a hydrophilic surface.

3 Claims, No Drawings

LITHOGRAPHIC PRINTING PLATE PRECURSOR

FIELD OF THE INVENTION

The present invention relates to a negative lithographic printing plate precursor comprising a support having a hydrophilic surface, and a hydrophilic image-forming layer. More specifically, the present invention relates to a lithographic printing plate precursor capable of manufacturing a plate by scan exposure based on digital signals, ensuring high sensitivity and long press life, and providing a printed matter free of residual color or staining. According to a preferred embodiment, the lithographic printing plate precursor can be developed with water or an aqueous solution or can be mounted and subjected to printing in a printing machine without passing through development.

BACKGROUND OF THE INVENTION

In general, the printing plate comprises an ink-receptive (i.e., a lithographic) image area for receiving ink during the printing process and a hydrophilic non-image area for receiving a fountain solution. For the original plate (i.e., the precursor) of such a lithographic printing plate, a PS plate comprising a hydrophilic support having provided thereon an ink-receptive (i.e., a lipophilic) photosensitive resin layer (ink-receptive layer) has heretofore been widely used. According to the plate-making process therefor, a plate is usually subjected to mask exposure through a lithographic film and then the non-image area is dissolved and removed with a developer to obtain a desired printing plate.

In recent years, digitization technology of electrically processing, storing and outputting image information using a computer has been widely popularized. To cope with this digitization technology, various new methods for outputting an image have been proposed and are actually used. To keep up with this tendency, demands are increasing for a computer-to-plate technique where a printing plate can be directly produced by scanning a ray having high directivity, such as laser ray, according to digitized image information and a lithographic film can be dispensed with. Thus, it is an important technical problem to obtain a printing plate precursor (i.e., sometimes, called “a printing original plate”) suitable therefor.

In the plate-making process of conventional PS plates, the step of dissolving and removing the non-image area after the exposure is indispensable. This additional wet processing as an indispensable step is another problem demanded to overcome in conventional techniques. Particularly in recent years, to take scrupulous care of the global environment is a great concern in the whole industry. From both of the environmental aspect and the process rationalization aspect to keep up with the digitization, demands for a simple processing, a dry processing or no processing are more keenly increasing.

From this standpoint, the following method has been proposed for eliminating the above-described processing step in conventional techniques. That is, a plate-making system for lithographic printing plate, called on-press developing system, has been proposed, where a photosensitive layer capable of allowing the non-image area of the printing original plate to be removed during the usual printing process is used and the plate after the exposure is developed on a printing press to obtain a final printing plate without passing through a development step. To speak more specifically, for example, a method of using a photosensitive layer soluble in a fountain solution or an ink solvent and dynamically removing the non-image area by the contact with the impression cylinder or blanket cylinder in the printing machine is known. However, if a conventional PS plate is applied to this printing plate in the on-press developing system, the original plate must be stored under completely light-shielding and/or constant temperature conditions until it is mounted on a printing press because the photosensitive layer is not fixed after the exposure.

In recent years, some solid lasers having high output have become available at a low cost, such as semiconductor laser and YAG laser. With this progress, a method of using such a laser is taking charge of highly promising means for solving the above-described technical problem. In the high power density exposure system using these high output solid lasers, various phenomena different from the photoreaction occurring in the photosensitive material system for the low to medium power density exposure can be used. More specifically, various structural changes such as chemical change, phase change and morphology change can be used. The recording system by this high power density exposure is called “heat-mode recording”. This is because in the high power density exposure system, the light energy absorbed by the photosensitive material is converted into heat in many cases and the heat generated is believed to bring about a desired phenomenon.

This heat-mode recording system is greatly advantageous in that fixing of an image after the exposure is not an essential matter.

More specifically, the phenomena used for the recording of an image on a heat-mode photosensitive material substantially do not occur in the exposure to light having an ordinary intensity or at an ordinary ambient temperature, therefore, fixing of an image after the exposure is not necessary. By virtue of this, a system may be established, for example, where a photosensitive layer insolubilized or solubilized by the heat-mode exposure is used, as a result, even when the layer after the imagewise exposure is exposed to the environmental light for an arbitrary time and then developed (removal of non-image area), the image obtained does not undergo any change.

By using this heat-mode recording, a lithographic printing original plate suitable for the above-described on-press developing system may be obtained.

As one preferred example of the method for manufacturing a lithographic printing plate according to the heat-mode recording, a method of providing a hydrophilic image-forming layer on a hydrophilic support, imagewise exposing it by heat-mode exposure to cause changes in the solubility and dispersibility of the hydrophilic layer and if desired, removing the unexposed area by wet development has been proposed.

For the original plate of this type, an image-forming material comprising a support having thereon a photosensitive layer containing a compound capable of generating an acid by the irradiation of an active ray, a compound having at least one bond capable of cross-linking in the presence of an acid and a cyanine dye having a specific chemical structure is disclosed, for example, in JP-A-10-239834 (the term “JP-A” as used herein means an “unexamined published Japanese patent application”). However, the photosensitive layer disclosed is not sufficiently high in the heat sensitivity and exhibits conspicuously low sensitivity in the heat-mode scan exposure. Furthermore, a problem is present in that the discrimination in the hydrophilicity/hydrophobicity before and after the exposure, namely, the change in the solubility is small. If the discrimination is small as such, the plate-making by the on-press developing system cannot be substantially performed.

Conventional original plates of heat-mode system have another serious problem, that is, the non-image area is poor in the resistance against staining or the image area is low in the strength. In other words, improvements are necessary in the point that the change in solubility of the image-forming layer upon exposure is small near the support as compared with the change near the surface of the image-forming layer. In the original plate of heat-mode system, heat generation at the heat-mode exposure is attributable to light absorption of a light absorbent in the recording layer. Therefore, the quantity of heat generated is large on the surface of recording layer and small near the support. As a result, the degree of change in solubility of the recording layer is relatively low near the support and the ink-receptive layer in the exposed area which must provide a hydrophobic ink-receptive layer is sometimes removed during the development and/or printing process. If the ink-receptive layer in the image area of a negative original plate is removed, there arises a problem of short press life in the printing performance. In particular, when a metal support having high thermal conductivity preferred in view of suitability for printing, such as Al, is used, the temperature near the support is much more prevented from increasing due to the thermal diffusion and the above-described problem comes out more seriously. For obtaining a sufficiently large change in solubility near the substrate, an extremely large exposure energy is necessary or an after-treatment such as heating must be performed after the exposure.

SUMMARY OF THE INVENTION

Accordingly, one object of the present invention is to provide a lithographic printing plate precursor capable of plate-making by scan exposure based on digital signals, favored with high sensitivity and good press life, and free of generation of scumming (i.e., staining).

Another object of the present invention is to provide a lithographic printing plate precursor which can be developed with water or an aqueous solution or can be mounted in a printing press as it is without passing through development and subjected to printing.

As a result of extensive investigations, the present inventors have found that when a specific amount of a specific infrared absorbent is applied to the photo-sensitive layer of a lithographic printing plate precursor, the exposed area becomes water-insoluble to form an image area having high press life and in the unexposed area which is water-soluble, a non-image area having no residual film on the support can be obtained. The present invention has been accomplished based on this finding.

More specifically, the present invention provides a lithographic printing plate precursor comprising a support having thereon a photosensitive layer containing 6 wt % or more of an infrared absorbent which changes from hydrophilic to hydrophobic by heat, the support having a hydrophilic support.

When the infrared absorbent used in the lithographic printing plate precursor of the present invention is irradiated by a laser of radiating an infrared ray, the hydrophilic functional group of the infrared absorbent is considered, not for certain, to decompose or desorb (i.e., release) and thereby allow the hydrophilic dye itself to become hydrophobic.

In the case where an infrared absorbent of not changing from hydrophilic to hydrophobic is used in a negative working lithographic printing plate precursor, if the dye is originally hydrophilic, the unexposed area shows good solubility in an aqueous solution but the image area is low in the water resistance and removed by the developer or fountain solution used during the printing. On the other hand, if the dye is originally hydrophobic, the exposed area shows good water resistance but the unexposed area is bad in the removability and cannot be removed by the developer or fountain solution used during the printing and staining occurs on the image area of the printed matter.

In the present invention, the infrared absorbent having hydrophilicity of a certain level or more becomes hydrophobic, therefore, a highly strong image-forming layer having high water resistance can be obtained in the exposed area and the unexposed area can have high solubility in an aqueous solution.

In other words, the lithographic printing plate precursor of the present invention contains as a photosensitive layer a specific amount of an infrared absorbent capable of changing from hydrophilic to hydrophobic by heat and thereby provides effects such that the plate-making can be made directly from digital data of a computer or the like using an infrared laser, high sensitivity can be obtained and the image area can be free of thinning (i.e., smearing), favored with good press life and prevented from occurrence of staining.

DETAILED DESCRIPTION OF THE INVENTION

The photosensitive layer of the lithographic printing plate precursor (i.e., hereinafter, called "lithographic printing original plate") of the present invention contains 6 wt % or more of an infrared absorbent capable of changing from hydrophilic to hydrophobic by heat (hereinafter sometimes simply referred to as "infrared absorbent", "infrared absorbent for use in the present invention" or "IR absorbent") and may additionally contain a hydrophilic polymer, a hydrophilic polymer compound capable of becoming hydrophobic by heat, and the like according to the end use.

Infrared Absorbent

The infrared absorbent contained in the photosensitive layer of the lithographic printing original plate of the present invention is not particularly limited as long as it changes from hydrophilic to hydrophobic by heat. However, a dye or pigment is preferred and those having a structure such that a hydrophilic functional group capable of decomposing or desorbing by heat is bonded directly or through a linking group to the mother nucleus of the dye or pigment are more preferred.

The hydrophilic functional group capable of decomposing or desorbing by heat in the infrared absorbent is not particularly limited but preferably selected from the hydrophilic functional groups represented by the following formulae (1) to (5):

(1)

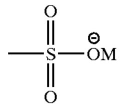

(2)

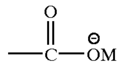

-continued (3)

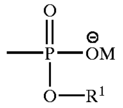

(4)

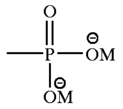

(5)

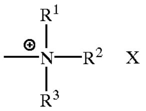

wherein M represents ion having a positive charge, X represents ion having a negative charge, and $R^1$, $R^2$ and $R^3$ each independently represents hydrogen, an alkyl group, an aryl group, an alkenyl group or an alkynyl group.

When the infrared absorbent contained in the photosensitive layer of the lithographic printing original plate of the present invention contains a hydrophilic functional group represented by any one of formulae (1) to (5), the hydrophilic functional group decomposes or desorbs by heat and the infrared absorbent becomes hydrophobic based on its original mother nucleus structure. As a result, a hydrophobic image area having low solubility in an aqueous solution is obtained in the exposed area of the photosensitive layer of the lithographic printing original plate of the present invention and the unexposed area can have high solubility in an aqueous solution.

In general, the functional groups $-SO_3^-M^+$ represented by formula (1) and $-COO^-M^+$ represented by formula (2) do not easily decompose or desorb by heat, however, when these functional groups each is bonded directly or through a relatively short linking group to the original mother nucleus structure of the infrared absorbent, they can highly efficiently receive the heat energy generated by the light-heat converting action of the infrared absorbent and can easily decompose or desorb.

In each of the hydrophilic functional groups represented by formulae (1) to (5), the ion having a positive charge represented by M forms an ion pair with the negative charge present in the hydrophilic functional group.

Therefore, M is present in a molar number necessary for having the equivalent charge to the negative charge present in the hydrophilic function group.

Specific examples of M include $H^+$, $Li^+$, $Na^+$, $K^+$, $Rb^+$, $Cs^+$, $Be^{2+}$, $Mg^{2+}$, $Ca^{2+}$, $Sr^{2+}$, $Ba^{2+}$, $Al^{3+}$, $Sn^{2+}$, $Sn^{4+}$, $Pb^{2+}$, $Pb^{3+}$, $Zn^{2+}$, $Hg^{2+}$, $Ti^{3+}$, $Ti^{4+}$, $V^{3+}$, $V^{3+}$, $V^{4+}$, $Cr^{2+}$, $Cr^{3+}$, $Mn^{2+}$, $Mn^{3+}$, $Fe^{2+}$, $Fe^{3+}$, $Co^{2+}$, $Co^{3+}$, $Ni^{2+}$, $Cu^+$, $Cu^{2+}$, $Ag^+$, ammonium ion, sulfonium ion, phosphonium ion, iodonium ion and diazonium ion.

Specific examples of the ammonium ion are set forth below, however, the present invention is by no means limited thereto.

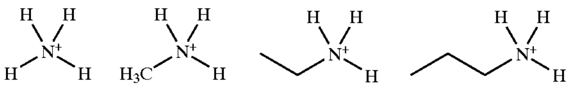

-continued

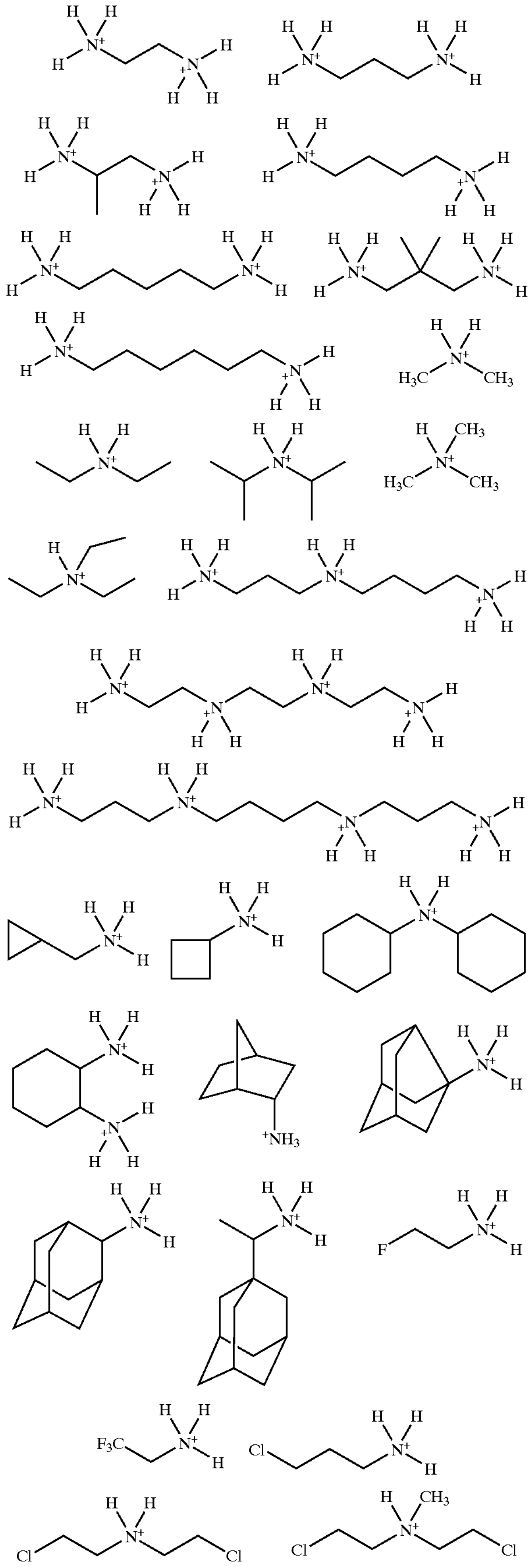

-continued
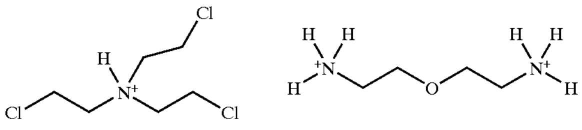
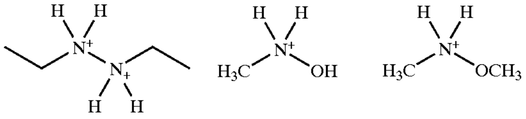
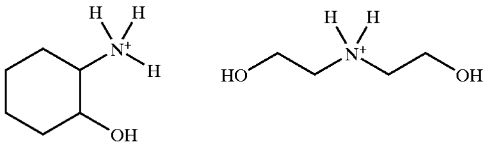
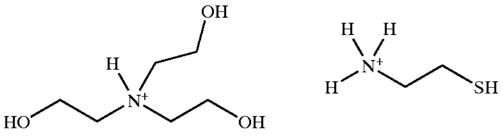
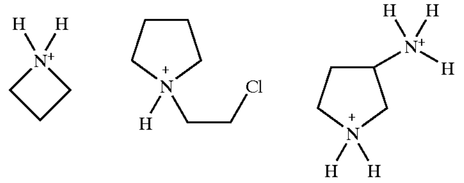
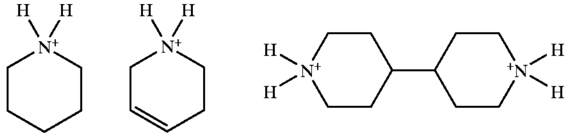
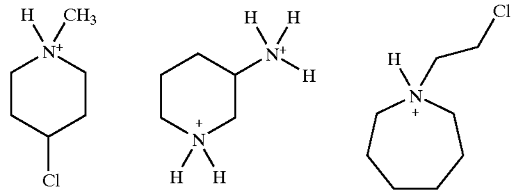
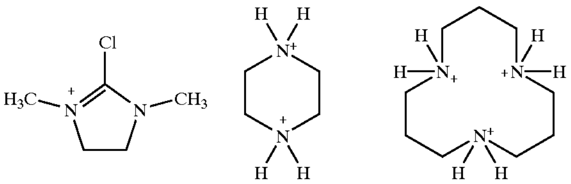
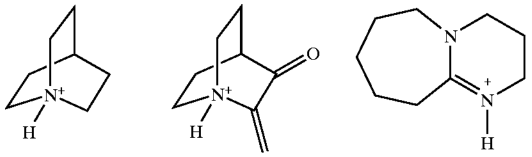
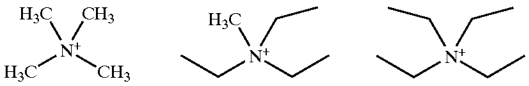
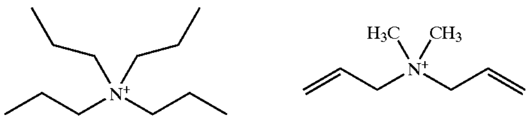
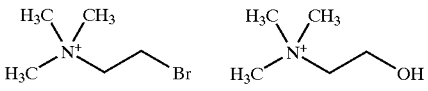
-continued
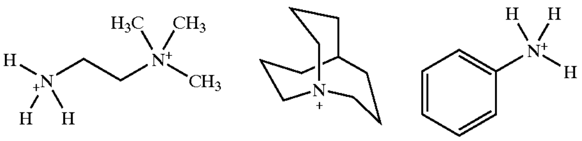
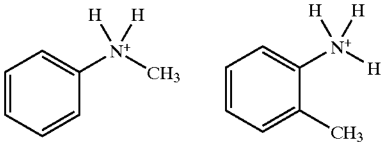
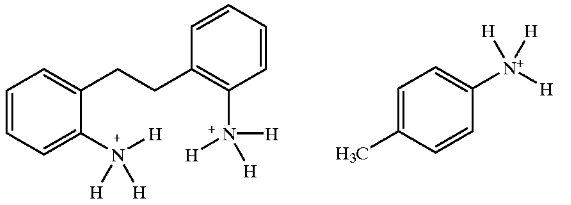
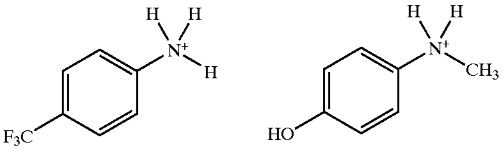
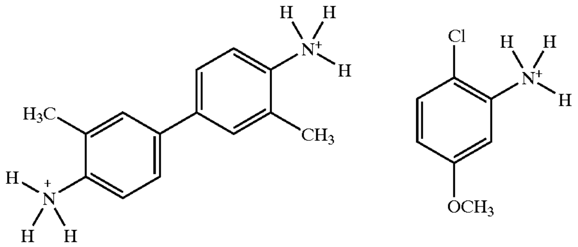
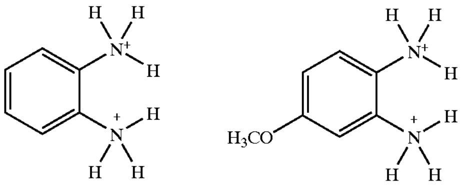
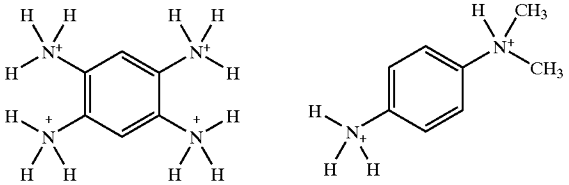
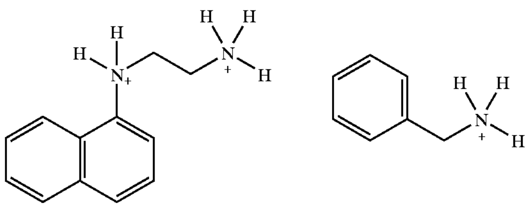
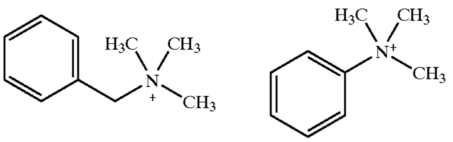

-continued
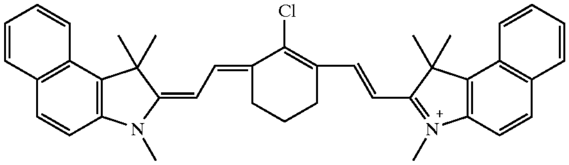
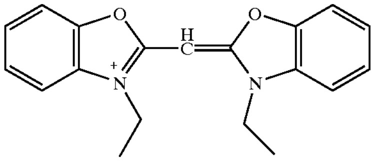
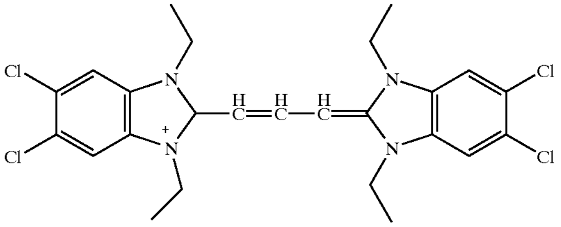
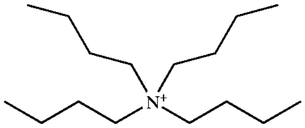
Specific examples of the sulfonium ion are set forth below, however, the present invention is by no means limited thereto.
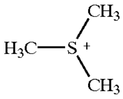
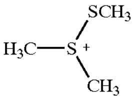
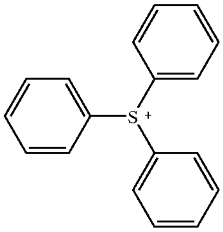
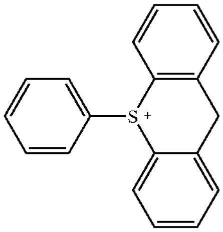
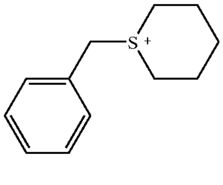
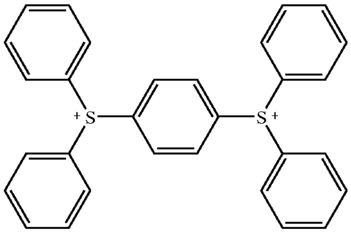
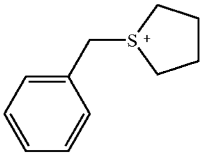
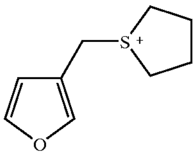
-continued
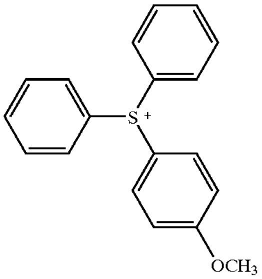
Specific examples of the phosphonium ion are set forth below, however, the present invention is by no means limited thereto.
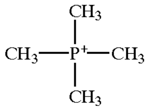
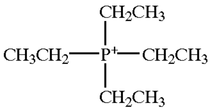
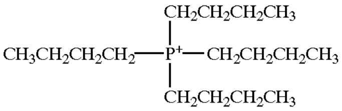
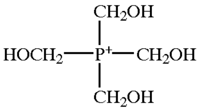
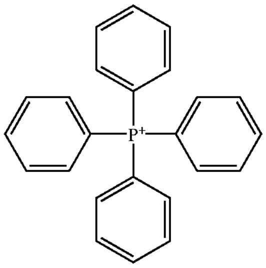
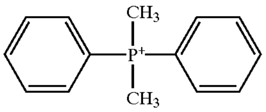
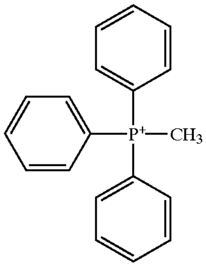
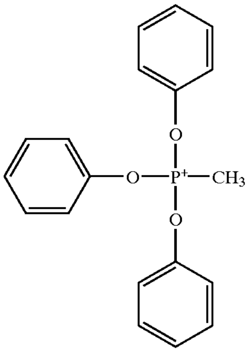
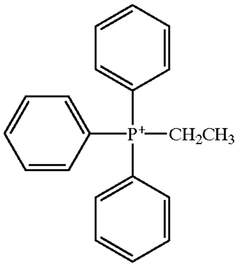
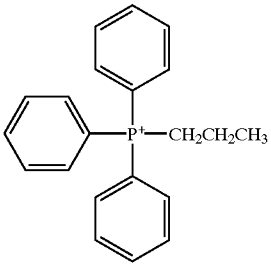

-continued
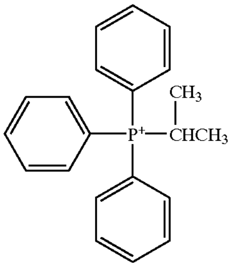
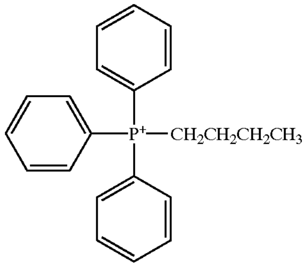
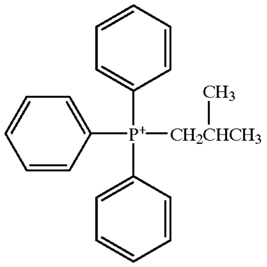
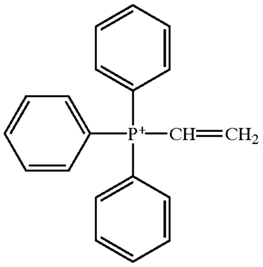
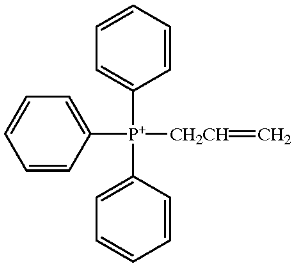
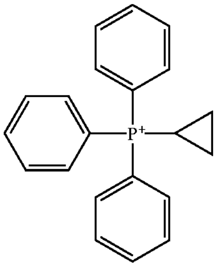
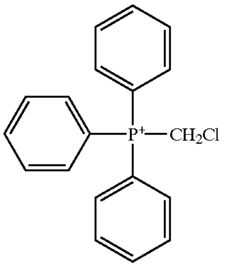
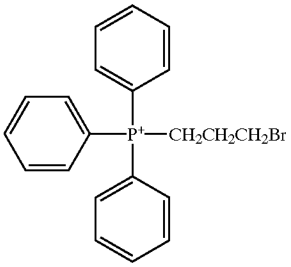
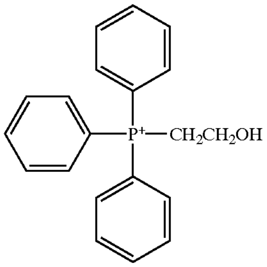
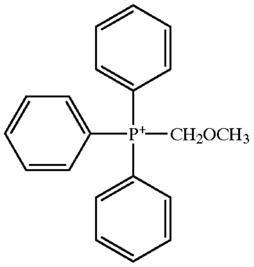
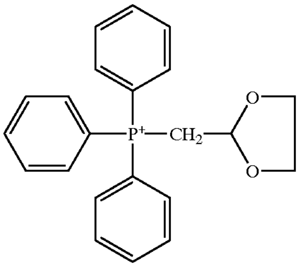
-continued
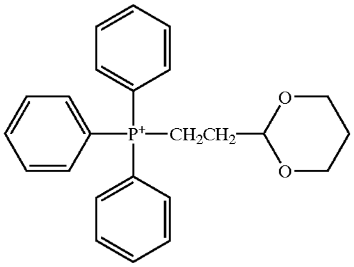
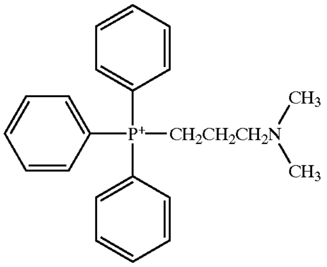
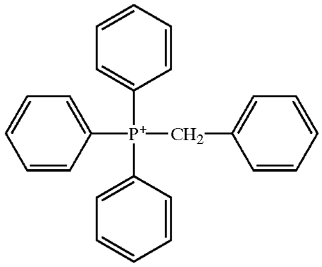
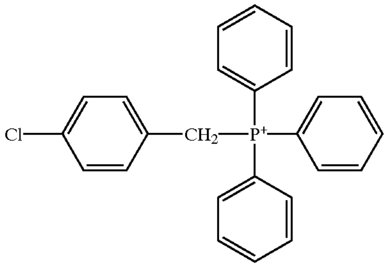
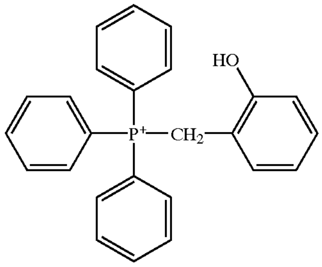
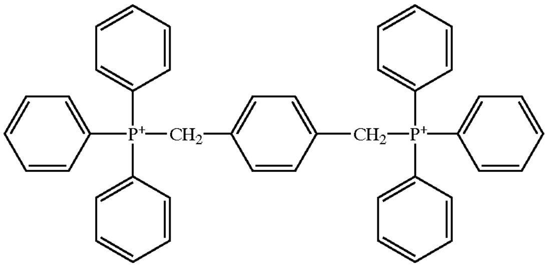

-continued

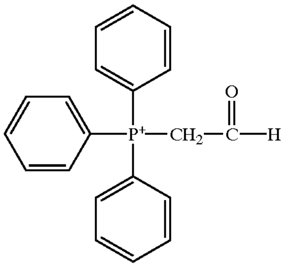

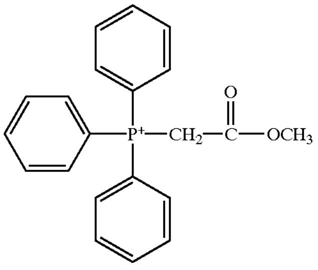

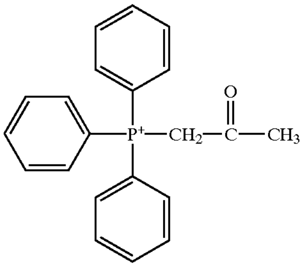

Specific examples of the iodonium ion are set forth below, however, the present invention is by no means limited thereto.

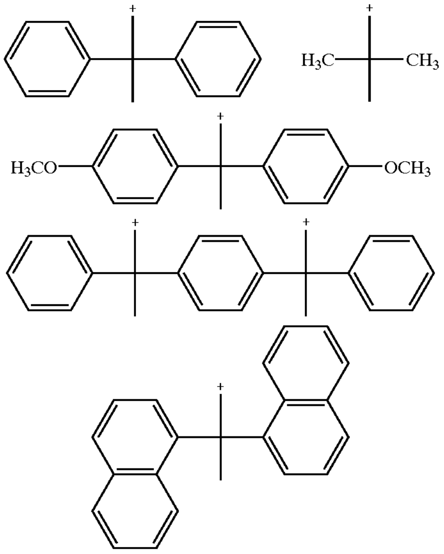

Specific examples of the diazonium ion are set forth below, however, the present invention is by no means limited thereto.

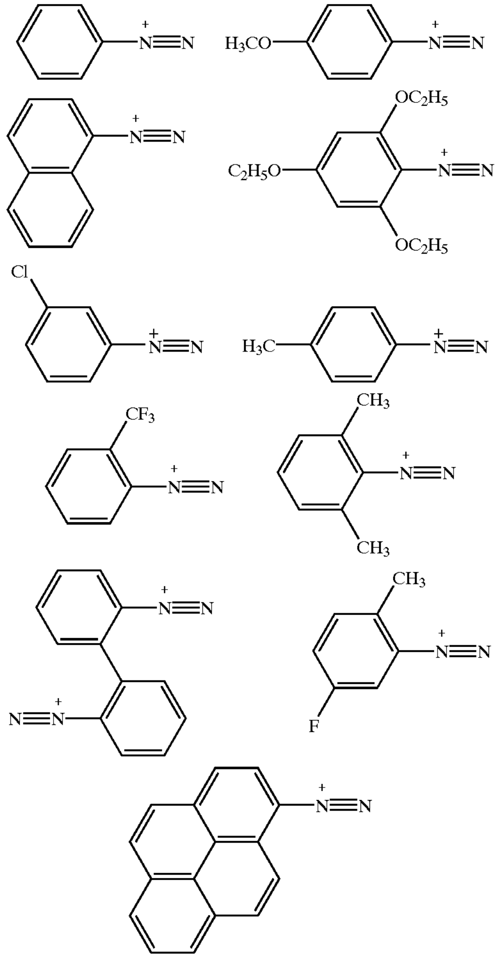

The ion having a negative charge represented by X forms an ion pair with the positive charge in the hydrophilic functional group. Therefore, X is present in a molar number necessary for having an equivalent charge to the positive charge present in the hydrophilic functional group.

Specific examples of X include $F^-$, $Cl^-$, $Br^-$, $I^-$, $HO^-$, $CN^-$, $SO_4^{2-}$, $HSO_4^-$, $SO_3^{2-}$, $HSO_3^-$, $NO_3^-$, $CO_3^{2-}$, $HCO_3^-$, $PF_6^-$, $BF_4^-$, $ClO_4^-$, $ClO_3^-$, $ClO_2^-$, $ClO^-$, $BrO_4^-$, $BrO_3^-$, $BrO_2^-$, $BrO^-$, $IO_4^-$, $IO_3^-$, $IO_2^-$, $IO^-$, sulfonate anion, carbonate anion, phosphonate anion and phosphate anion.

Specific examples of the sulfonate anion are set forth below, however, the present invention is by no means limited thereto.

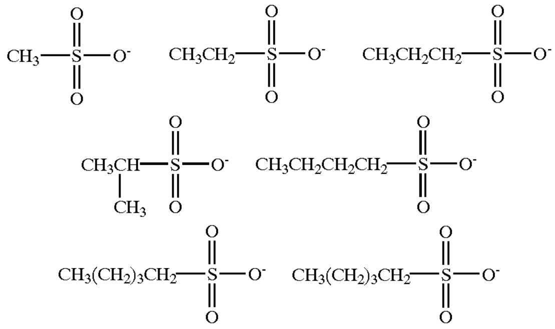

-continued
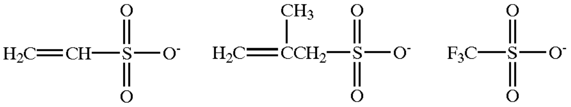
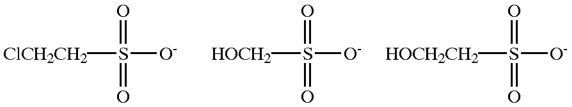
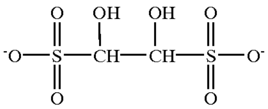
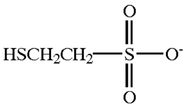
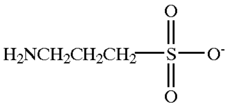
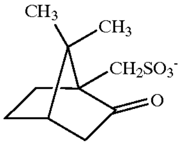
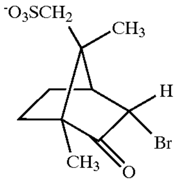
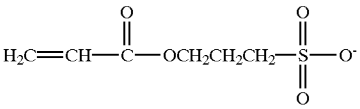
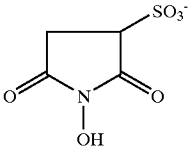
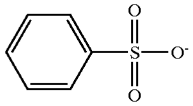
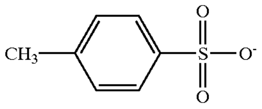
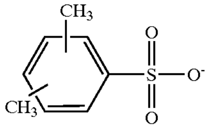
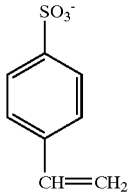
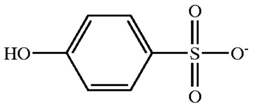
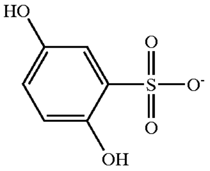
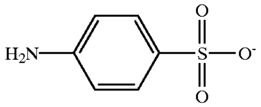
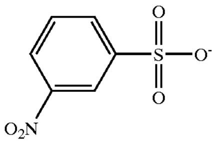
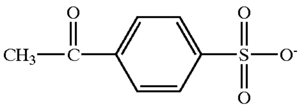
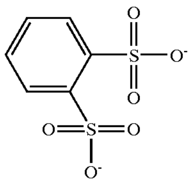
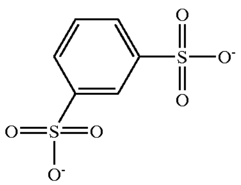
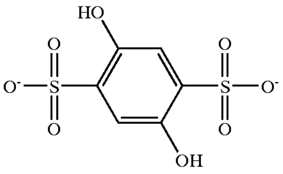
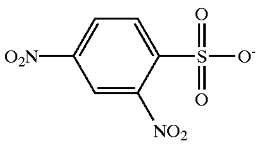
-continued
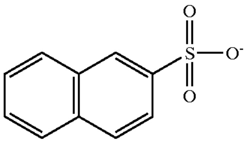
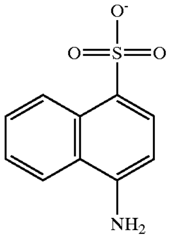
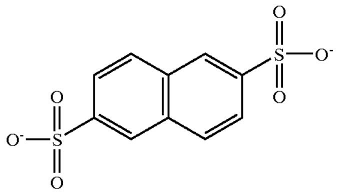
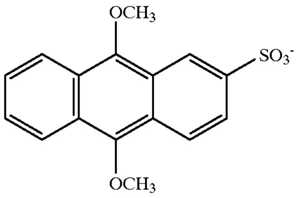
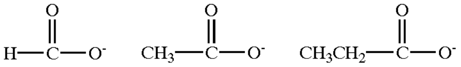
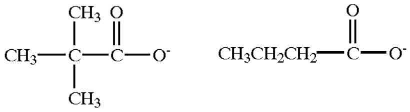
Specific examples of the carbonate anion are set forth below, however, the invention is by no means limited thereto.
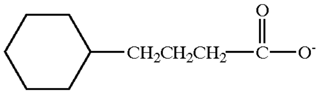
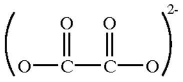
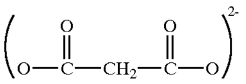
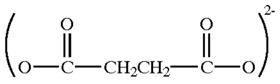
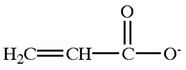
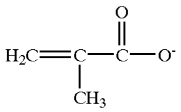
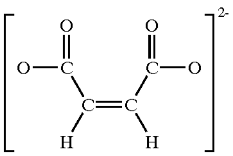
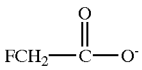
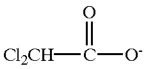
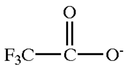
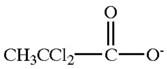

-continued
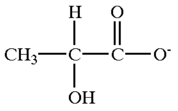
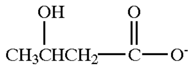
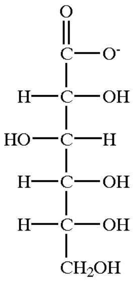
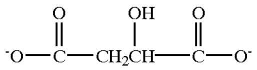
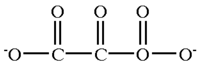
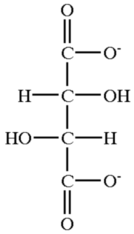
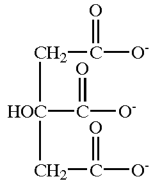
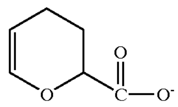
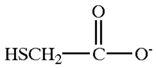
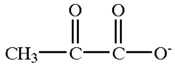
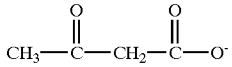
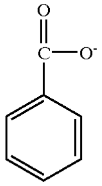
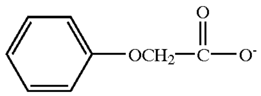
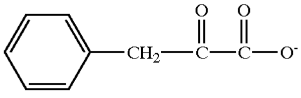
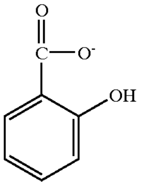
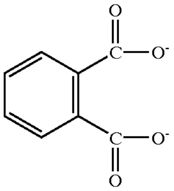
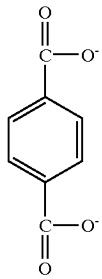
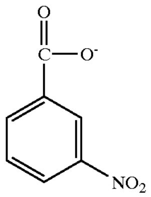
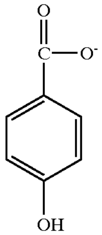
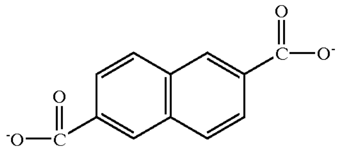
Specific examples of the phosphonate anion are set forth below, however, the present invention is by no means limited thereto.
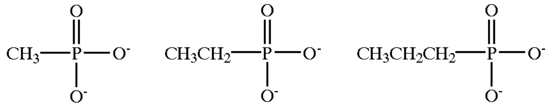
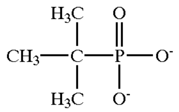
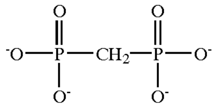
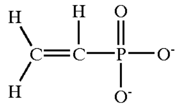
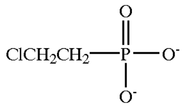
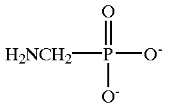
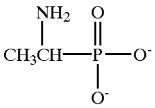
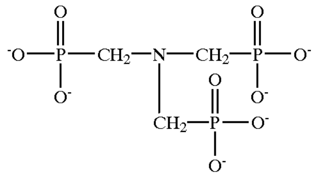
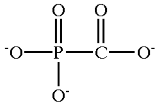
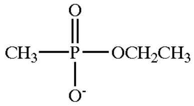
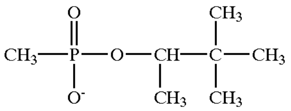
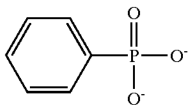
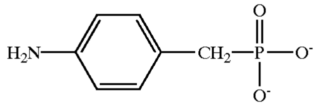
Specific examples of the phosphate anion are set forth below, however, the present invention is by no means limited thereto.
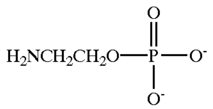
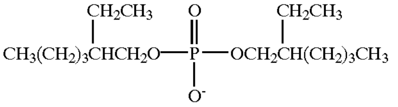
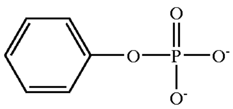
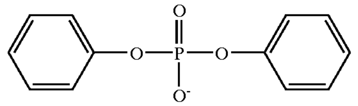
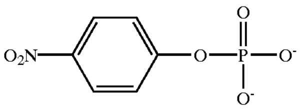
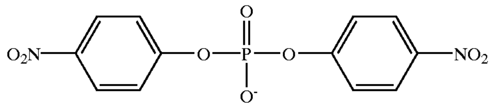

-continued

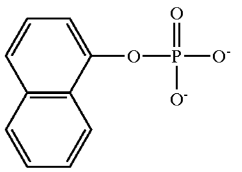

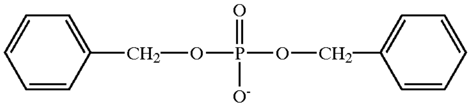

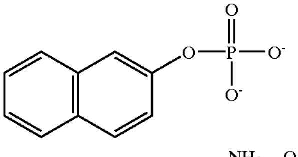

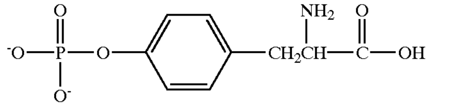

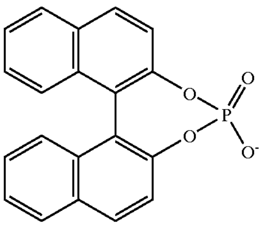

$PO_4^{3-}$, $HPO_4^{2-}$, $H_2PO_4^{-}$,

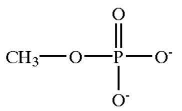

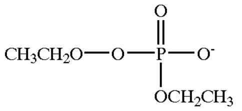

Among these anions, anions suitably used in the present invention are $F^-$, $Cl^-$, $Br^-$, $I^-$, $HO^-$, $CN^-$, $SO_4^{2-}$, $NO_3^-$, $CO_3^{2-}$, $PF_6^-$, $BF_4^-$, $ClO_4^-$, sulfonate anion, carbonate anion, phosphonate anion and phosphate anion.

When $R^1$, $R^2$ and $R^3$ each represents an alkyl group, the alkyl group includes a linear, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a hexadecyl group, an octadecyl group, an eicosyl group, an isopropyl group, an isobutyl group, an sec-butyl group, a tert-butyl group, an isopentyl group, a neopentyl group, a 1-methyl group, an isohexyl group, a 2-ethylhexyl group, a 2-methylhexyl group, a cyclohexyl group, a cyclopentyl group and 2-norbornyl group. Among these, a linear alkyl group having from 1 to 12 carbon atoms, a branched alkyl group having from 3 to 12 carbon atoms, and a cyclic alkyl group having from 5 to 10 carbon atoms are preferred.

When $R^1$, $R^2$ and $R^3$ each represents a substituted alkyl group, the substituent is a monovalent nonmetallic atom group exclusive of hydrogen. Preferred examples thereof include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N-aryl-N-arylureido group, an N',N'-diaryl- N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and a conjugated basic group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group ($—PO_3H_2$) and a conjugated basic group thereof (hereinafter referred to as a phosphonato group), a dialkylphosphono group ($—PO_3(alkyl)_2$), a diarylphosphono group ($—PO_3(aryl)_2$), an alkylarylphosphono group ($—PO_3(alkyl)(aryl)$), a monoalkylphosphono group ($—PO_3H(alkyl)$) and a conjugated basic group thereof (hereinafter referred to as an alkylphosphonato group), a monoarylphosphono group ($—PO_3H(aryl)$) and a conjugated basic group thereof (hereinafter referred to as an arylphosphonato group), a phosphonooxy group ($—OPO_3H_2$) and a conjugated basic group thereof (hereinafter referred to as a phosphonato oxy group), a dialkylphosphonooxy group ($—OPO_3(alkyl)_2$), a diarylphosphonooxy group ($—OPO_3(aryl)_2$), an alkylarylphosphonooxy group ($—OPO_3(alkyl)(aryl)$), a monoalkylphosphonooxy group ($—OPO_3H(alkyl)$) and a conjugated basic group thereof (hereinafter referred to as an alkylphosphonato oxy group), a monoarylphosphonooxy group ($—OPO_3H(aryl)$) and a conjugated basic group thereof (hereinafter referred to as an arylphosphonato oxy group), a cyano group, a nitro group, an aryl group, an alkenyl group and an alkynyl group.

Examples of the alkyl group in these substituents include the above-described alkyl groups. Examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonato phenyl group, a phosphonophenyl group and a phosphonato phenyl group. Examples of the alkenyl group include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. $R^5$ in the acyl group ($R^5CO$—) includes hydrogen and the above-described alkyl and aryl groups.

Among these substituents, more preferred are a halogen atom (e.g., —F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonato oxy group, an aryl group and an alkenyl group.

The alkylene group in the substituted alkyl group includes a divalent organic residue resulting from eliminating any one of hydrogen atoms on the above-described alkyl group having from 1 to 20 carbon atoms and preferred are a linear alkylene group having from 1 to 12 carbon atoms, a branched alkylene group having from 3 to 12 carbon atoms and a cyclic alkylene group having from 5 to 10 carbon atoms. Specific preferred examples of the substituted alkyl group obtained by combining the substituent and the alkylene group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonato butyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonato hexyl group, a diethylphosphonobutyl group, a diphenylphosphonopropyl group, a methylphosphonobutyl group, a methyl phosphonato butyl group, a tolylphosphonohexyl group, a tolyl phosphonato hexyl group, a phosphonooxypropyl group, a phosphonato oxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

When $R^1$, $R^2$ and $R^3$ each represents an aryl group, the aryl group includes a condensed ring formed by from 1 to 3 benzene rings and a condensed ring formed by a benzene ring and a 5-membered unsaturated ring. Examples thereof include a phenyl group, a naphthyl group, an anthryl group, a phenanthryl group, an indenyl group, an acenaphthenyl group and a fluorenyl group. Among these, a phenyl group and a naphthyl group are preferred. In addition to the carbocyclic aryl group, the aryl group includes a heterocyclic aryl group. Examples of the heterocyclic aryl group include those having from 3 to 20 carbon atoms and from 1 to 5 hetero atoms, such as pyridyl group, furyl group and quinolyl, benzofuryl, thioxanthone and carbazole groups each condensed with a benzene ring.

When $R^1$, $R^2$ and $R^3$ each represents a substituted aryl group, the substituted aryl group includes those having a monovalent nonmetallic atom group exclusive of hydrogen as a substituent on the ring-forming carbon atoms of the above-described aryl group. Preferred examples of the substituent include the above-described alkyl groups, substituted alkyl groups and substituents for the substituted alkyl group.

Preferred examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonato phenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonato phenyl group, a diethylphosphonophenyl group, a diphenylphosphonophenyl group, a methylphosphonophenyl group, a methyl phosphonato phenyl group, a tolylphosphonophenyl group, a tolyl phosphonato phenyl group, an allyl group, a 1-propenylmethyl group, 2-butenyl group, a 2-methylallylphenyl group, a 2-methylpropenylphenyl group, a 2-propynylphenyl group, a 2-butynylphenyl group and a 3-butynylphenyl group.

When $R^1$, $R^2$ and $R^3$ each represents an alkenyl group, a substituted alkenyl group [$—C(R^4)═C(R^5)(R^6)$], an alkynyl group or a substituted alkynyl group [$—C≡—C(R^7)$], $R^4$ to $R^7$ each is a monovalent nonmetallic atom group. Preferred examples of $R^4$ to $R^7$ include hydrogen atom, a halogen atom, an alkyl group, a substituted alkyl group, an aryl group and a substituted aryl group. Examples of these groups include those described above and more preferred examples of the substituent for $R^4$ to $R^7$ include hydrogen atom, a halogen atom and a linear, branched or cyclic alkyl group having from 1 to 10 carbon atoms.

Specific examples of the alkenyl group, the substituted alkenyl group, the alkynyl group and the substituted alkynyl group include a vinyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a propynyl group and a phenylethyl group.

Among these examples of $R^1$, $R^2$ and $R^3$, preferred are an alkyl group, a substituted alkyl group, an aryl group and a substituted aryl group.

For the mother nucleus of a dye or pigment as an IR absorbent for use in the present invention, any may be suitably used as long as the dye or pigment has absorption in the region of from 700 to 1,200 nm. However, on taking account of the mechanism such that the hydrophilic functional group decomposes or desorbs by laser exposure and thereby the dye itself changes to be hydrophobic, the dye or pigment itself is preferably hydrophobic. Preferred examples of the IR absorbent of this type include polymethine dyes, cyanine dyes, squarylium dyes, pyrylium dyes, diimmonium dyes, phthalocyanine compounds, triarylmethane dyes and metal dithiolene. Among these, more preferred are polymethine dyes, cyanine dyes, squarylium dyes, pyrylium dyes, diimmonium dyes and phthalocyanine compounds, and in view of the suitability for synthesis, still more preferred are polymethine dyes, cyanine dyes and phthalocyanine compounds.

Specific examples of the mother nucleus of a dye or pigment as the IR absorbent for use in the present invention are set forth below, however, the present invention is by no means limited thereto.

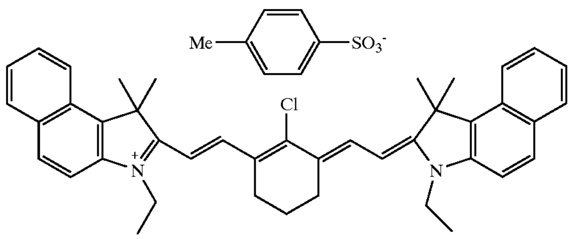

UV absorbent (4)

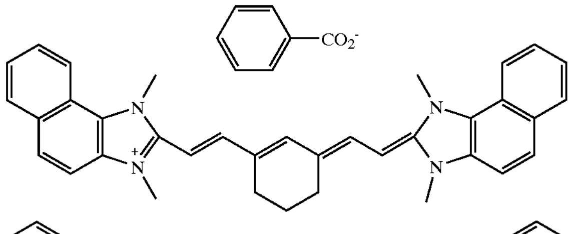

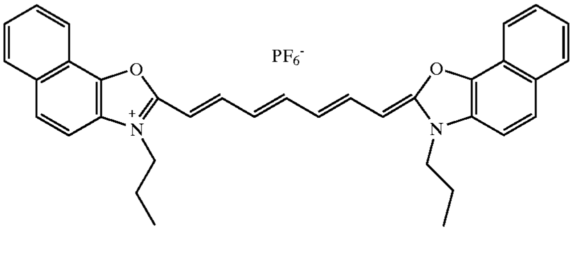

-continued

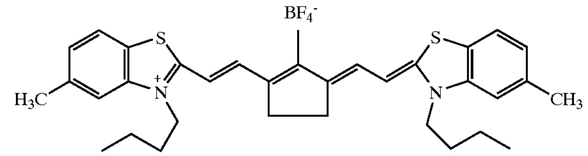

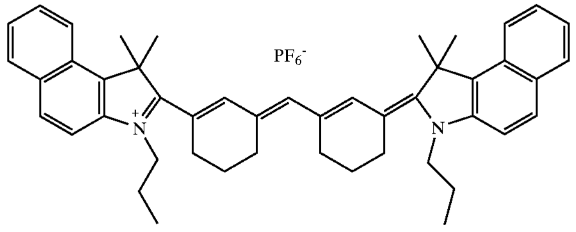

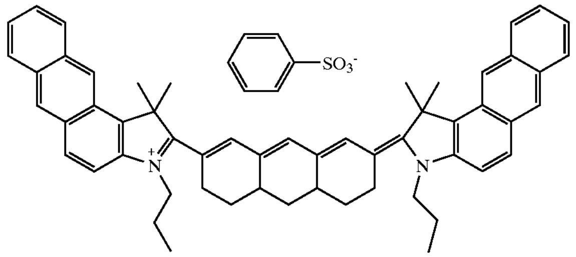

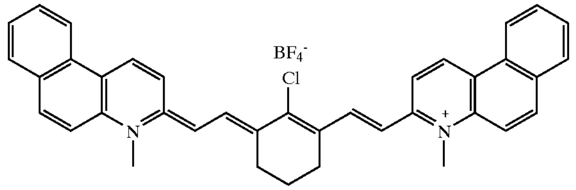

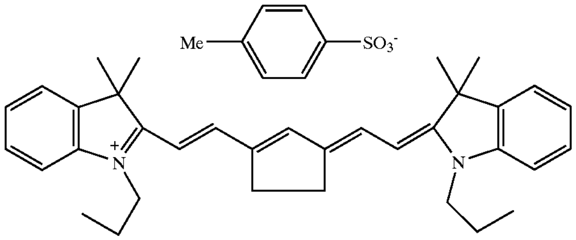

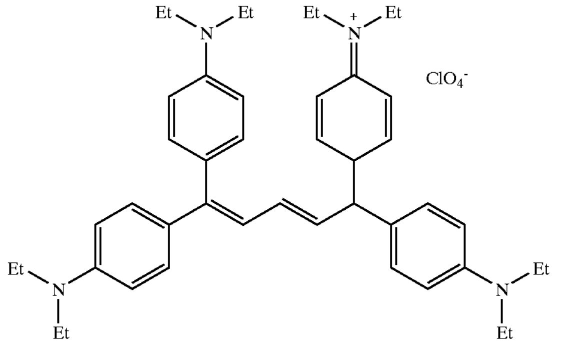

-continued

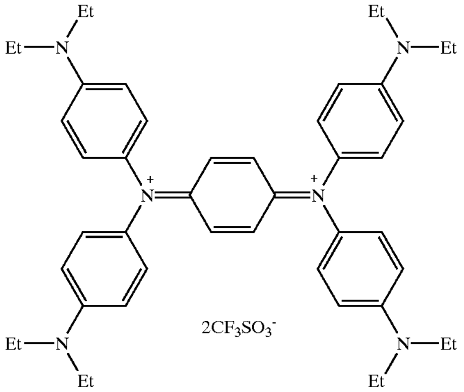

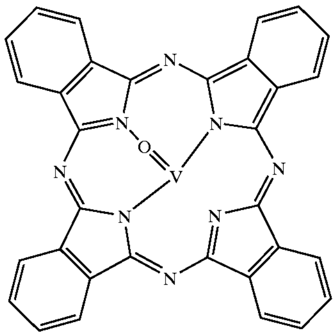

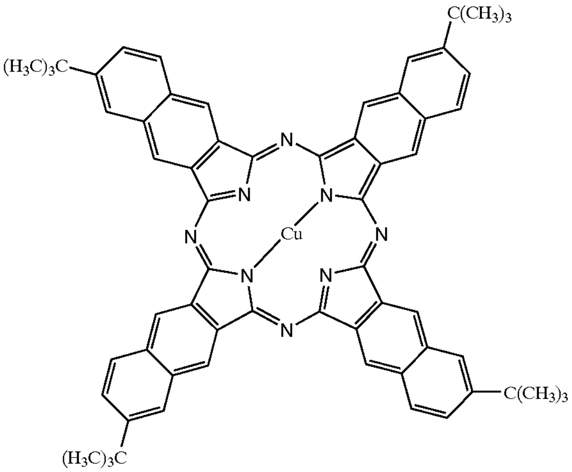

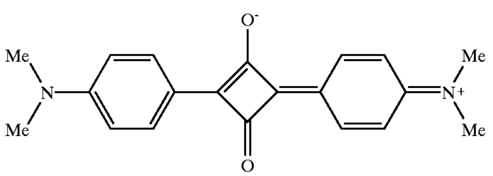

-continued

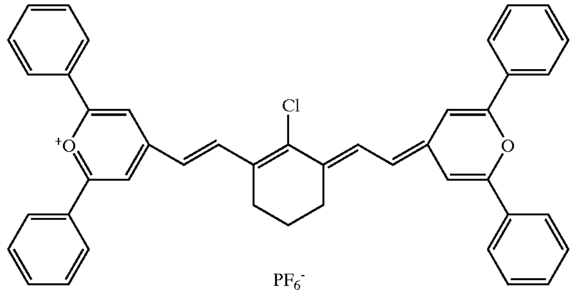

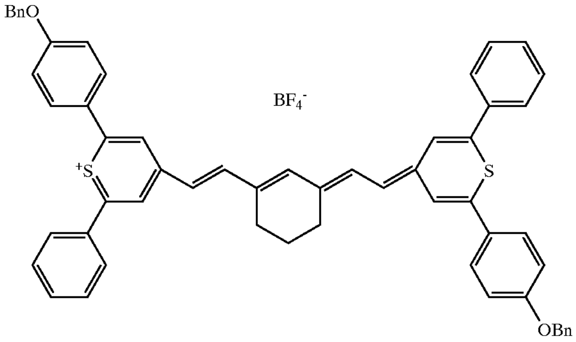

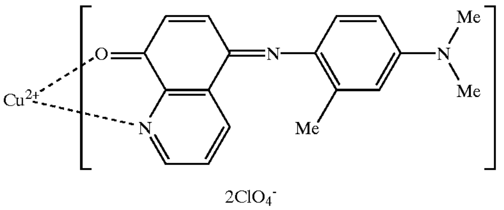

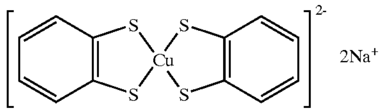

The infrared absorbent contained in the photosensitive layer of the lithographic printing original plate of the present invention may be any infrared absorbent as long as it is a dye or pigment having the above-described hydrophilic functional group. Specific examples of the infrared absorbent contained in the photosensitive layer of the lithographic printing original plate of the present invention are set forth below, however, the present invention is by no means limited thereto.

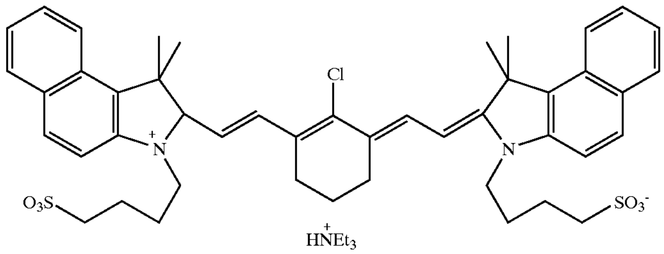
IR absorbent (1)
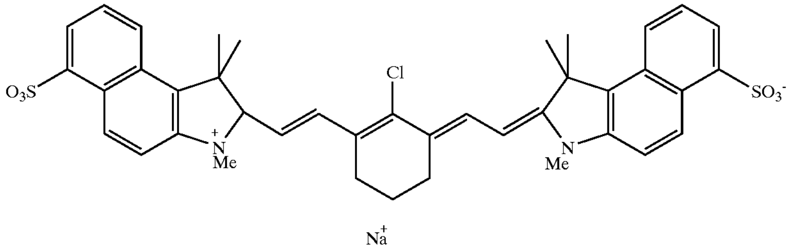
IR absorbent (2)
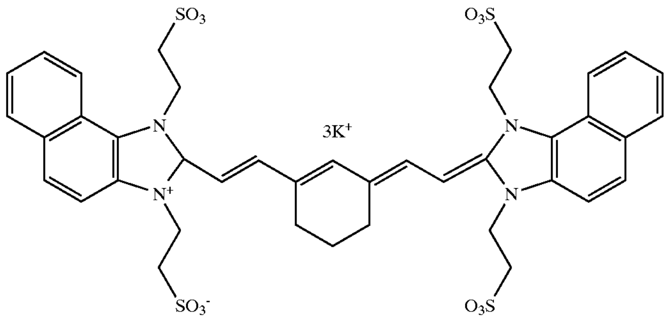
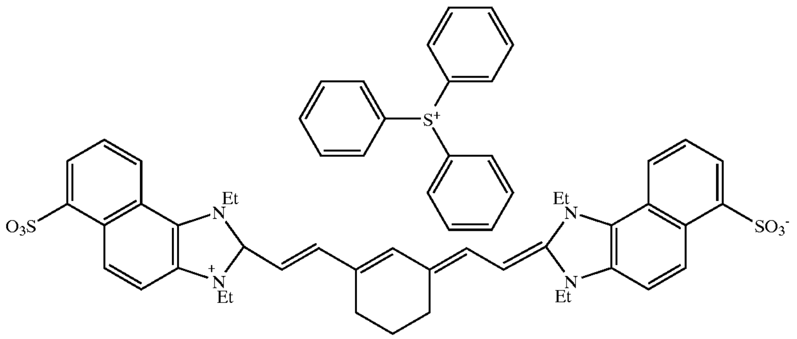
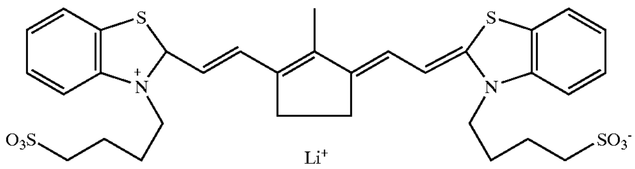
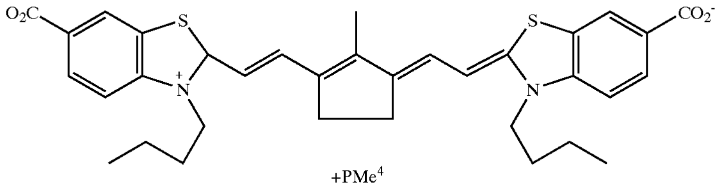

-continued
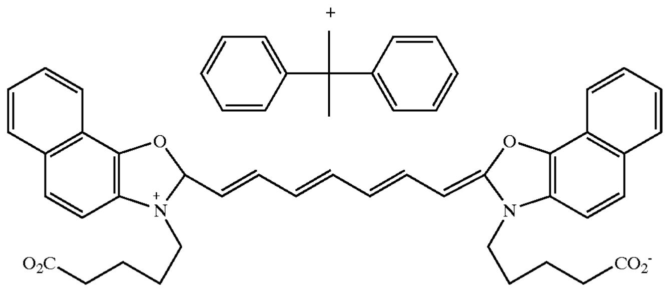
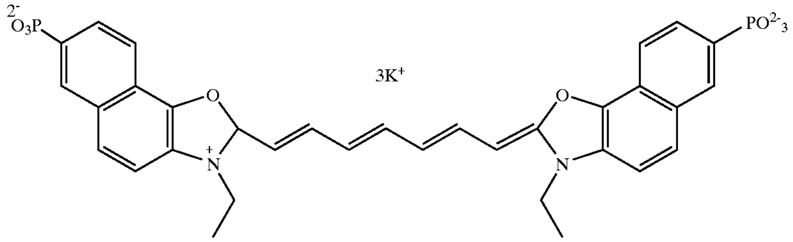
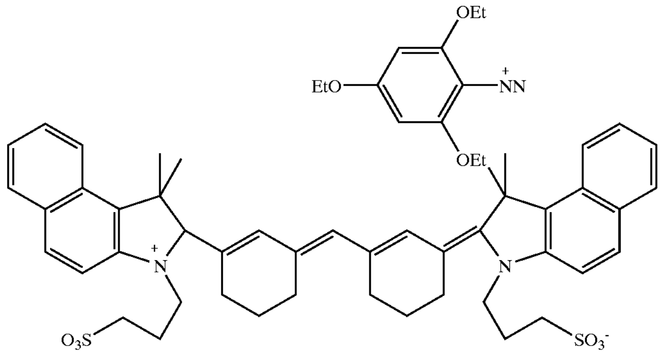
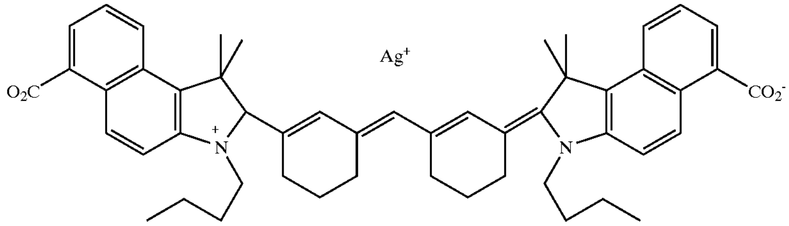
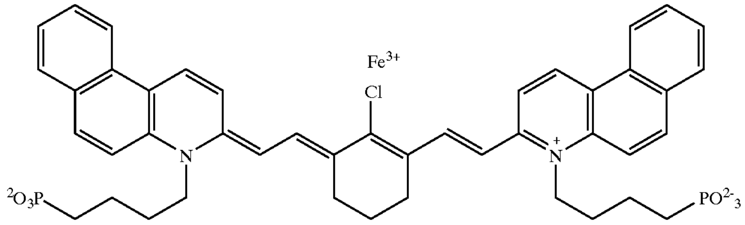
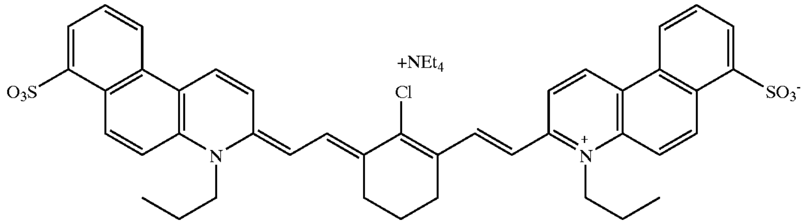

-continued
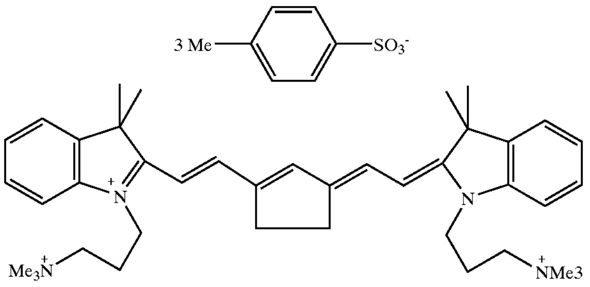
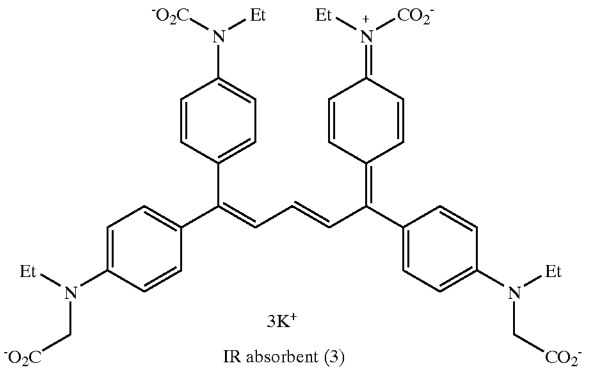
IR absorbent (3)
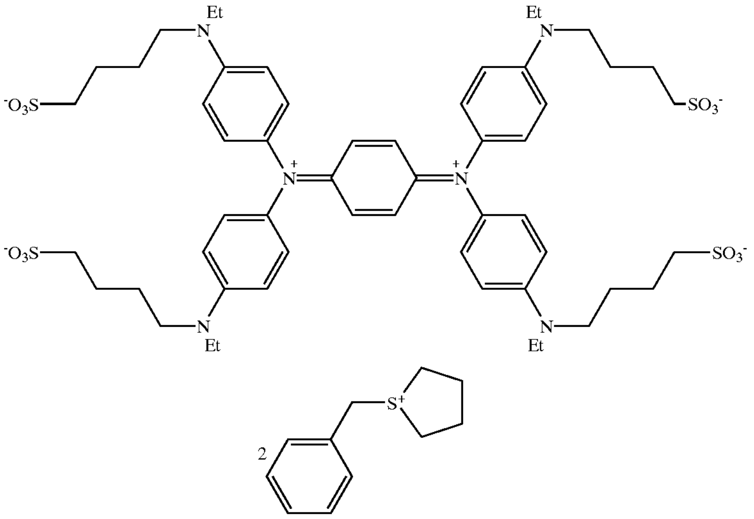
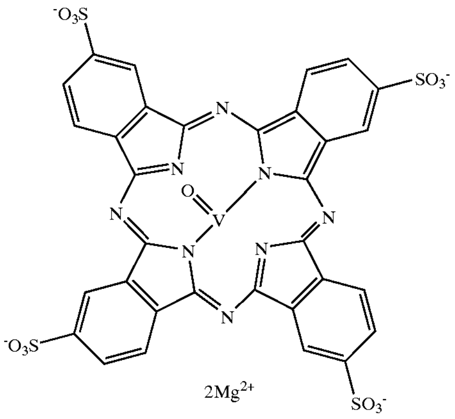

-continued

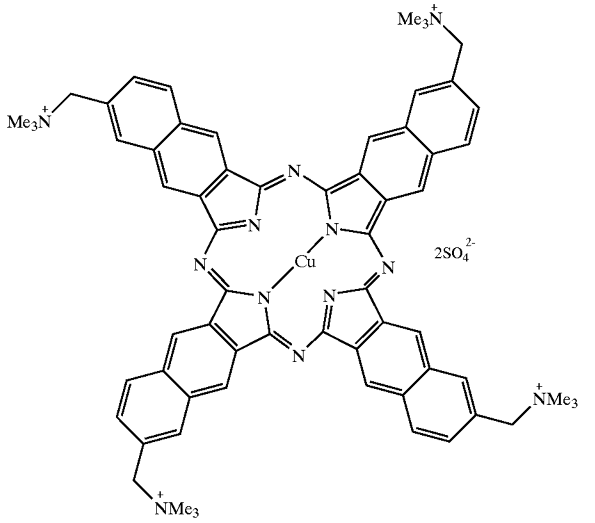

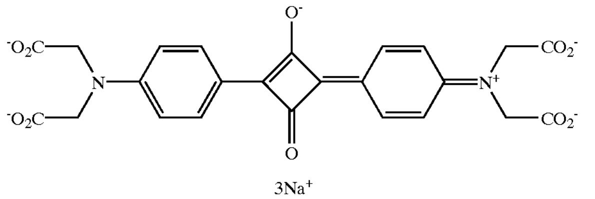

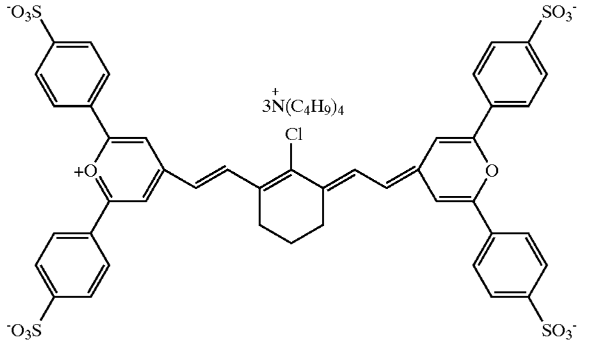

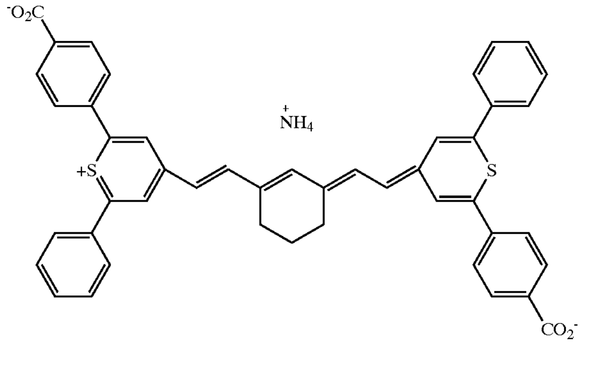

In the present invention, the content of the infrared absorbent is 6 wt % or more, preferably 10 wt % or more, more preferably 15 wt % or more, based on the entire solid content of the photosensitive layer. If the content of the infrared absorbent is less than 6 wt %, the sensitivity disadvantageously decreases.

The components in the photosensitive layer, other than the infrared absorbent, for use in the lithographic printing original plate of the present invention are described below.

[Hydrophilic Polymer]

The photosensitive layer of the lithographic printing original plate of the present invention may further contain a hydrophilic polymer. By constructing as such, the following effects can be attained. Since the infrared absorbent and the polymer both are hydrophilic before a predetermined treatment is applied, the photosensitive layer exhibits ink-repellency and at the same time, can be easily removed by water. After the predetermined treatment is applied, the infrared absorbent becomes hydrophobic, as a result, the photosensitive layer allows inking and also is greatly reduced in the solubility in water. Therefore, by mounting the lithographic printing original plate of the present invention on a printing machine, a printing plate of on-press development system where the unexposed area can be removed using the fountain solution in the printing machine, can be obtained without passing through any processing.

The hydrophilic polymer for use in the present invention includes known water-soluble polymer (this means a polymer capable of completely dissolving in water), pseudo water-soluble polymer (this means an amphipathic polymer having a water-soluble macro-moiety and a water-insoluble micro-moiety) and water-swellable polymer (this means a polymer which is swellable with water but not soluble). In other words, the hydrophilic polymer means a polymer which adsorbs or absorbs water in ordinary use conditions and which dissolves in or swells with water. As long as this definition is satisfied, any known natural polymer compound or synthetic polymer compound may be used as the hydrophilic polymer.

Examples of the natural polymer compound as the hydrophilic polymer for use in the present invention include the following compounds: starch-acrylonitrile-based graft polymer hydrolysates, starch-acrylic acid-based graft polymers, starch-styrenesulfonic acid-based graft polymers, starch-vinylsulfonic acid-based graft polymers, starch-acrylamide-based graft polymers, carboxylated methyl cellulose, methyl cellulose, hydroxypropyl methyl cellulose, hydroxyethyl cellulose, cellulose xanthate, cellulose-acrylonitrile-based graft polymers, cellulosestyrenesulfonic acid-based graft polymers, carboxymethyl cellulose-based cross-linked products, hyaluronic acid, agarose, collagen, milk casein, acid casein, rennet casein, ammonia casein, casein potassium, borax casein, glue, gelatin, gluten, soybean protein, alginate, ammonium alginate, potassium alginate, sodium alginate, gum arabic, tragacanth gum, karaya gum, guar gum, locust bean gum, Irish moss, soybean lecithin, pectic acid, starch, carboxylated starch, agar, dextrin and mannan.

Examples of the synthetic polymer compound as the hydrophilic polymer for use in the present invention include polymer compounds containing, as a monomer component, at least one of a carboxylic acid derivative-based ethylenically unsaturated compound, a sulfonic acid derivative-based ethylenically unsaturated compound, an ammonium salt-based ethylenically unsaturated compound and an alcohol-based ethylenically unsaturated compound (hereinafter simply referred to as Hydrophilic Polymer A), chemical reaction treated products thereof, vinylpyrrolidone-based copolymers, polyvinyl alcohol, polyethylene oxide, poly(ethylene oxide-co-propylene oxide), aqueous urethane resin, water-soluble polyester, hydroxyethyl (meth)acrylate-based polymers, poly(vinyl methyl ether-co-maleic acid anhydride), polyethylene glycol di(meth)acrylate-based cross-linked polymers and polypropylene glycol di(meth)acrylate-based cross-linked polymers.

The carboxylic acid derivative-based ethylenically unsaturated compound is an ethylenically unsaturated compound having at least one functional group within the molecule, such as a carboxyl group (—COOH), a carboxylate group (—COOM), a carboxylic acid ester group (—$COOR^1$), a carboxylic acid amide group (—$CON(R^2)(R^3)$), a carboxylic acid imide group (—$CON(R^2)CO$—) or a carboxylic acid anhydride group (—COOCO—) (wherein M represents ion having a positive charge, $R^1$ represents an alkyl group, an aryl group, an alkenyl group or an alkynyl group, and $R^2$ and $R^3$ each represents hydrogen, an alkyl group, an aryl group, an alkynyl group or an alkenyl group).

When M represents ion having a positive charge, examples thereof include the above-described ions from which $H^+$ is eliminated.

When $R^1$, $R^2$ and $R^3$ each represents an alkyl group, an aryl group, an alkenyl group or an alkynyl group, examples of the functional group include those described above.

Specific examples of this ethylenically unsaturated compound include known monomers such as acrylic acid, acrylates, acrylic acid esters, acrylamides, methacrylic acid, methacrylates, methacrylic acid esters, methacrylamides, maleic acid, maleates, maleic acid anhydride, maleic acid esters, maleic acid amides, maleic acid imides, itaconic acid, itaconates, itaconic acid anhydride, itaconic acid esters, itaconic acid amides, itaconic acid imides, crotonic acid, crotonates, crotonic acid esters, crotonic acid amides, fumaric acid, fumarates, fumaric acid esters, fumaric acid amides, mesaconic acid, mesaconates, mesaconic acid esters, mesaconic acid amides, α,β-unsaturated lactones, α,β-unsaturated lactams, vinylbenzoic acid, vinyl benzoates, vinylbenzoic acid esters, vinylbenzoic acid amides, alkenylcarboxylic acids, alkenylcarboxylates, alkenylcarboxylic acid esters, alkenylcarboxylic acid amides, alkenylcarboxylic acid imides and alkenylcarboxylic acid anhydrides.

Specific examples of the acrylates include lithium acrylate, sodium acrylate, potassium acrylate, magnesium acrylate, calcium acrylate, zinc acrylate, ammonium acrylate, tetramethylammonium acrylate, tetraethylammonium acrylate and tetra-n-butylammonium acrylate.

Specific examples of the acrylic acid esters include methyl acrylate, ethyl acrylate, (n- or i-)propyl acrylate, (n-, i-, sec- or tert-)butyl acrylate, pentyl acrylate, hexyl acrylate, heptyl acrylate, octyl acrylate, nonyl acrylate, decyl acrylate, amyl acrylate, 2-ethylhexyl acrylate, dodecyl acrylate, chloroethyl acrylate, 2 -hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, and 2-(hydroxyphenylcarbonyloxy)ethyl acrylate.

Specific examples of the acrylamides include acrylamide, N-methylacrylamide, N-ethylacrylamide, N-(n- or i-)propylacrylamide, N-(n-, i-, sec- or tert-)butylacrylamide, N-benzylacrylamide, N-hydroxyethylacrylamide, N-phenylacrylamide, N-tolylacrylamide, N-(hydroxyphenyl)-acrylamide, N-(sulfamoylphenyl) acrylamide, N-(phenylsufonyl)acrylamide, N-(tolylsulfonyl)acrylamide, N,N-dimethylacrylamide, N-methyl-N-phenylacrylamide and N-hydroxyethyl-N-methylacrylamide.

Specific examples of the methacrylates include lithium methacrylate, sodium methacrylate, potassium methacrylate, magnesium methacrylate, calcium methacrylate, zinc methacrylate, ammonium methacrylate, tetramethylammonium methacrylate, tetraethylammonium methacrylate and tetra-n-butylammonium methacrylate.

Specific examples of the methacrylic acid esters include methyl methacrylate, ethyl methacrylate, (n- or i-)propyl methacrylate, (n-, i-, sec- or tert-)butyl methacrylate, pentyl methacrylate, hexyl methacrylate, heptyl methacrylate, octyl methacrylate, nonyl methacrylate, decyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl carboxylated starch, agar, dextrin and mannan. methacrylate, sulfamoylphenyl methacrylate and 2-(hydroxyphenylcarbonyloxy)ethyl methacrylate.

Specific examples of the methacrylamides include methacrylamide, N-methylmethacrylamide, N-ethylmethacrylamide, N-(n- or i-)propylmethacrylamide, N-(n-, i-, sec- or tert-)butylmethacrylamide, N-benzylmethacrylamide, N-hydroxyethylmethacrylamide, N-phenylmethacrylamide, N-tolylmethacrylamide, N-(hydroxyphenyl)methacrylamide, N-(sulfamoylphenyl) methacrylamide, N-(phenylsulfonyl)methacrylamide, N-(tolylsulfonyl)methacrylamide, N,N-dimethylmethacrylamide, N-methyl-N-phenylmethacrylamide and N-hydroxyethyl-N-methylmethacrylamide.

Specific examples of the crotonates include lithium crotonate, sodium crotonate, potassium crotonate, magnesium crotonate, calcium crotonate, zinc crotonate, ammonium crotonate, tetramethylammonium crotonate, tetraethylammonium crotonate and tetra-n-butylammonium crotonate.

Specific examples of the crotonic acid esters include methyl crotonate, ethyl crotonate, (n- or i-)propyl crotonate, (n-, i-, sec- or tert-)butyl crotonate, pentyl crotonate, hexyl crotonate, heptyl crotonate, octyl crotonate, nonyl crotonate, decyl crotonate, amyl crotonate, 2-ethylhexyl crotonate, dodecyl crotonate, chloroethyl crotonate, 2-hydroxyethyl crotonate, 2-hydroxypropyl crotonate, 5-hydroxypentyl crotonate, cyclohexyl crotonate, allyl crotonate, trimethylolpropane monocrotonate, pentaerythritol monocrotonate, benzyl crotonate, methoxybenzyl crotonate, chlorobenzyl crotonate, hydroxybenzyl crotonate, hydroxyphenethyl crotonate, dihydroxyphenethyl crotonate, furfuryl crotonate, tetrahydrofurfuryl crotonate, phenyl crotonate, hydroxyphenyl crotonate, chlorophenyl crotonate, sulfamoylphenyl crotonate and 2-(hydroxyphenylcarbonyloxy)ethyl crotonate.

Specific examples of the crotonic acid amides include crotonic acid amide, N-methylcrotonic acid amide, N-ethylcrotonic acid amide, N-(n- or i-)propylcrotonic acid amide, N-(n-, i-, sec- or tert-)butylcrotonic acid amide, N-benzylcrotonic acid amide, N-hydroxyethylcrotonic acid amide, N-phenylcrotonic acid amide, N-tolylcrotonic acid amide, N-(hydroxyphenyl)crotonic acid amide, N-(sulfamoylphenyl)crotonic acid amide, N-(phenylsulfonyl)-crotonic acid amide, N-(tolylsulfonyl) crotonic acid amide, N,N-dimethylcrotonic acid amide, N-methyl-N-phenylcrotonic acid amide and N-hydroxyethyl-N-methylcrotonic acid amide.

Specific examples of the maleates include monolithium maleate, monosodium maleate, monopotassium maleate, magnesium maleate, calcium maleate, zinc maleate, disodium maleate, dipotassium maleate, monoethyl maleate potassium salt, diammonium maleate, bis (tetramethylammonium) maleate and bis (tetraethylammonium) maleate.

Specific examples of the maleic acid esters include dimethyl maleate, diethyl maleate, di(n- or i-)propyl maleate, di(n-, i-, sec- or tert-)butyl maleate, diphenyl maleate, diallyl maleate, monomethyl maleate, monoethyl maleate, mono(n- or i-)propyl maleate, mono(n-, i-, sec- or tert-)butyl maleate, dibenzyl maleate, monobenzyl maleate, methyl ethyl maleate, methyl propyl maleate and ethyl propyl maleate.

Specific examples of the maleic acid amides include maleic acid amide, N-methylmaleic acid amide, N-ethylmaleic acid amide, N-(n- or i-)propylmaleic acid amide, N-(n-, i-, sec- or tert-)butylmaleic acid amide, N-benzylmaleic acid amide, N-hydroxyethylmaleic acid amide, N-phenylmaleic acid amide, N-tolylmaleic acid amide, N-(hydroxyphenyl)maleic acid amide, N-(sulfamoylphenyl)maleic acid amide, N-(phenylsulfonyl) maleic acid amide, N-(tolylsulfonyl)maleic acid amide, N,N-dimethylmaleic acid amide, N-methyl-N-phenylmaleic acid amide, N-hydroxyethyl-N-methylmaleic acid amide, N-methylmaleic acid monoamide, N-ethylmaleic acid monoamide, N,N-dimethylmaleic acid monoamide, N-methyl-N'-ethylmaleic acid amide and N-methyl-N'-phenylmaleic acid amide.

Specific examples of the maleic acid imides include maleic acid imide, N-methylmaleic acid imide, N-ethylmaleic acid imide, N-(n- or i-)propylmaleic acid imide, N-(n-, i-, sec- or tert-)butylmaleic acid imide, N-benzylmaleic acid imide, N-hydroxyethylmaleic acid imide, N-phenylmaleic acid imide, N-tolylmaleic acid imide, N-(hydroxyphenyl)maleic acid imide, N-(sulfamoylphenyl)maleic acid imide, N-(phenylsulfonyl) maleic acid imide and N-(tolylsulfonyl)maleic acid imide.

Specific examples of the itaconates include monolithium itaconate, monosodium itaconate, monopotassium itaconate, magnesium itaconate, calcium itaconate, zinc itaconate, disodium itaconate, dipotassium itaconate, monoethyl itaconate potassium salt, diammonium itaconate, bis (tetramethylammonium) itaconate and bis (tetraethylammonium) itaconate.

Specific examples of the itaconic acid esters include dimethyl itaconate, diethyl itaconate, di(n- or i-)propyl itaconate, di(n-, i-, sec- or tert-)butyl itaconate, diphenyl itaconate, diallyl itaconate, monomethyl itaconate, monoethyl itaconate, mono(n- or i-)propyl itaconate, mono(n-, i-, sec- or tert-)butyl itaconate, dibenzyl itaconate, monobenzyl itaconate, methyl ethyl itaconate, methyl propyl itaconate and ethyl propyl itaconate.

Specific examples of the itaconic acid amides include itaconic acid amide, N-methylitaconic acid amide, N-ethylitaconic acid amide, N-(n- or i-)propylitaconic acid amide, N-(n-, i-, sec- or tert-)butylitaconic acid amide, N-benzylitaconic acid amide, N-hydroxyethylitaconic acid amide, N-phenylitaconic acid amide, N-tolylitaconic acid amide, N-(hydroxyphenyl)itaconic acid amide, N-(sulfamoylphenyl)itaconic acid amide, N-(phenylsulfonyl)itaconic acid amide, N-(tolylsulfonyl) itaconic acid amide, N,N-dimethylitaconic acid amide, N-methyl-N-phenylitaconic acid amide, N-hydroxyethyl-N-methylitaconic acid amide, N-methylitaconic acid monoamide, N-ethylitaconic acid monoamide, N,N-dimethylitaconic acid monoamide, N-methyl-N'-ethylitaconic acid amide and N-methyl-N'-phenylitaconic acid amide.

Specific examples of the itaconic acid imides include itaconic acid imide, N-methylitaconic acid imide, N-ethylitaconic acid imide, N-(n- or i-)propylitaconic acid imide, N-(n-, i-, sec- or tert-)butylitaconic acid imide, N-benzylitaconic acid imide, N-hydroxyethylitaconic acid imide, N-phenylitaconic acid imide, N-tolylitaconic acid imide, N-(hydroxyphenyl)itaconic acid imide, N-(sulfamoylphenyl)itaconic acid imide, N-(phenylsulfonyl)itaconic acid imide and N-(tolylsulfonyl) itaconic acid imide.

Specific examples of the fumarates include monolithium fumarate, monosodium fumarate, monopotassium fumarate, magnesium fumarate, calcium fumarate, zinc fumarate, disodium fumarate, dipotassium fumarate, monoethyl fumarate potassium salt, diammonium fumarate, bis(tetramethylammonium) fumarate and bis(tetraethylammonium) fumarate.

Specific examples of the fumaric acid esters include dimethyl fumarate, diethyl fumarate, di(n- or i-)propyl fumarate, di(n-, i-, sec- or tert-)butyl fumarate, diphenyl fumarate, diallyl fumarate, monomethyl fumarate, monoethyl fumarate, mono(n- or i-)propyl fumarate, mono(n-, i-, sec- or tert-)butyl fumarate, dibenzyl fumarate, monobenzyl fumarate, methyl ethyl fumarate, methyl propyl fumarate and ethyl propyl fumarate.

Specific examples of the fumaric acid amides include fumaric acid amide, N-methylfumaric acid amide, N-ethylfumaric acid amide, N-(n- or i-)propylfumaric acid amide, N-(n-, i-, sec- or tert-)butylfumaric acid amide, N-benzylfumaric acid amide, N-hydroxyethylfumaric acid amide, N-phenylfumaric acid amide, N-tolylfumaric acid amide, N-(hydroxyphenyl)fumaric acid amide, N-(sulfamoylphenyl)fumaric acid amide, N-(phenylsulfonyl)fumaric acid amide, N-(tolylsulfonyl) fumaric acid amide, N,N-dimethylfumaric acid amide, N-methyl-N-phenylfumaric acid amide, N-hydroxyethyl-N-methylfumaric acid amide, N-methylfumaric acid monoamide, N-ethylfumaric acid monoamide, N,N-dimethylfumaric acid monoamide, N-methyl-N'-ethylfumaric acid amide and N-methyl-N'-phenylfumaric acid amide.

Specific examples of the mesaconates include monolithium mesaconate, monosodium mesaconate, monopotassium mesaconate, magnesium mesaconate, calcium mesaconate, zinc mesaconate, disodium mesaconate, dipotassium mesaconate, monoethyl mesaconate potassium salt, diammonium mesaconate, bis(tetramethylammonium) mesaconate and bis(tetraethylammonium) mesaconate.

Specific examples of the mesaconic acid esters include dimethyl mesaconate, diethyl mesaconate, di(n- or i-)propyl mesaconate, di(n-, i-, sec- or tert-)butyl mesaconate, diphenyl mesaconate, diallyl mesaconate, monomethyl mesaconate, monoethyl mesaconate, mono(n- or i-)propyl mesaconate, mono(n-, i-, sec- or tert-)butyl mesaconate, dibenzyl mesaconate, monobenzyl mesaconate, methyl ethyl mesaconate, methyl propyl mesaconate and ethyl propyl mesaconate.

Specific examples of the mesaconic acid amides include mesaconic acid amide, N-methylmesaconic acid amide, N-ethylmesaconic acid amide, N-(n- or i-)propylmesaconic acid amide, N-(n-, i-, sec- or tert-)butylmesaconic acid amide, N-benzylmesaconic acid amide, N-hydroxyethylmesaconic acid amide, N-phenylmesaconic acid amide, N-tolylmesaconic acid amide, N-(hydroxyphenyl)mesaconic acid amide, N-(sulfamoylphenyl)mesaconic acid amide, N-(phenylsulfonyl)mesaconic acid amide, N-(tolylsulfonyl) mesaconic acid amide, N,N-dimethylmesaconic acid amide, N-methyl-N-phenylmesaconic acid amide, N-hydroxyethyl-N-methylmesaconic acid amide, N-methylmesaconic acid monoamide, N-ethylmesaconic acid monoamide, N,N-dimethylmesaconic acid monoamide, N-methyl-N'-ethylmesaconic acid amide and N-methyl-N'-phenylmesaconic acid amide.

Specific examples of the α,β-unsaturated lactones include the following compounds.

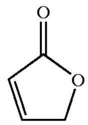
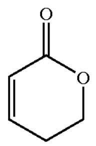
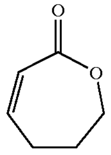
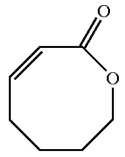
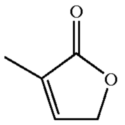
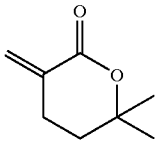
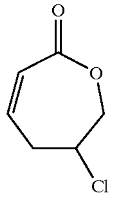
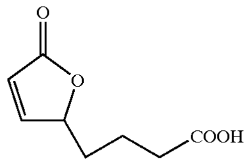
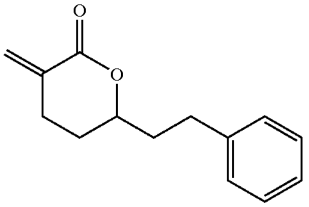
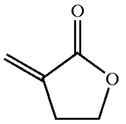
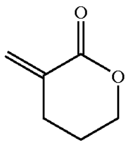
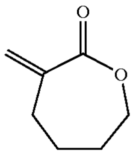
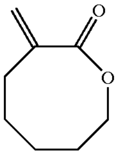
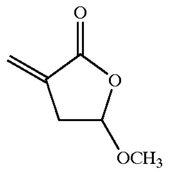
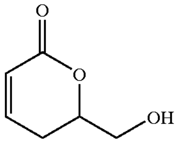
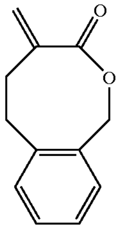
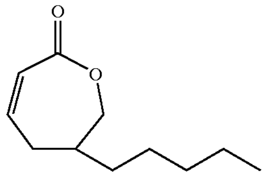
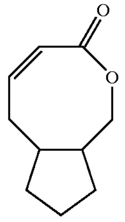

Specific examples of the α,β-unsaturated lactams include the following compounds.

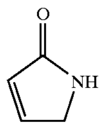
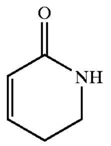
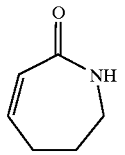
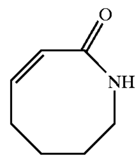

-continued

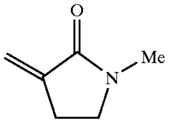
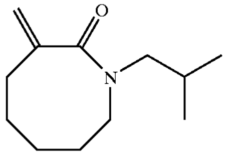
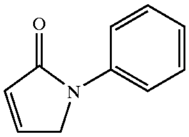
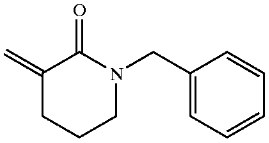
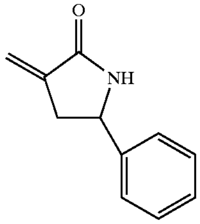
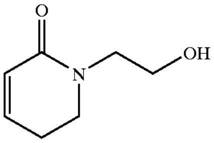
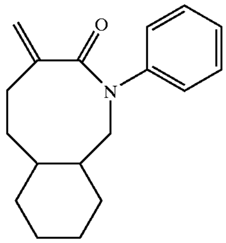
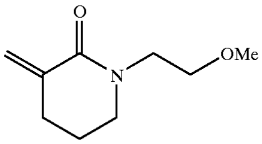
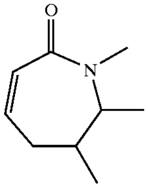
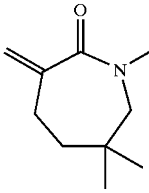
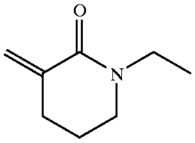
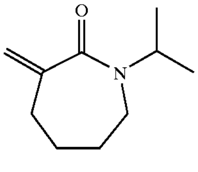
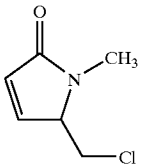
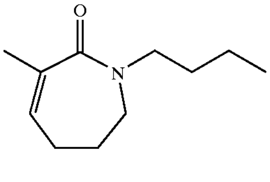
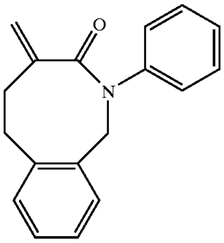

Specific examples of the vinyl benzoates include lithium vinyl benzoate, sodium vinyl benzoate, potassium vinyl benzoate, magnesium vinyl benzoate, calcium vinyl benzoate, zinc vinyl benzoate, ammonium vinyl benzoate, tetramethylammonium vinyl benzoate, tetraethylammonium vinyl benzoate and tetra-n-butylammonium vinyl benzoate.

Specific examples of the vinylbenzoic acid esters include methylvinyl benzoate, ethylvinyl benzoate, (n- or i-)propylvinyl benzoate, (n-, i-, sec- or tert-)butylvinyl benzoate, pentylvinyl benzoate, hexylvinyl benzoate, heptylvinyl benzoate, octylvinyl benzoate, nonylvinyl benzoate, decylvinyl benzoate, amylvinyl benzoate, 2-ethylhexylvinyl benzoate, dodecylvinyl benzoate, chloroethylvinyl benzoate, 2-hydroxyethylvinyl benzoate, 2-hydroxypropylvinyl benzoate, 5-hydroxypentyl-4-vinyl benzoate, cyclohexyl vinyl benzoate, allyl vinyl benzoate, trimethylolpropane monovinyl benzoate, pentaerythritol monovinyl benzoate, benzylvinyl benzoate, methoxybenzylvinyl benzoate, chlorobenzylvinyl benzoate, hydroxybenzylvinyl benzoate, hydroxyphenethylvinyl benzoate, dihydroxyphenethylvinyl benzoate, furfurylvinyl benzoate, tetrahydrofurfurylvinyl benzoate, phenylvinyl benzoate, hydroxyphenylvinyl benzoate, chlorophenylvinyl benzoate, sulfamoylphenylvinyl benzoate and 2-(hydroxyphenylcarbonyloxy)ethylvinyl benzoate Specific examples of the vinylbenzoic acid amides include vinylbenzoic acid amide, N-methylvinylbenzoic acid amide, N-ethylvinylbenzoic acid amide, N-(n- or i-)propylvinylbenzoic acid amide, N-(n-, i-, sec- or tert-)butylvinylbenzoic acid amide, N-benzylvinylbenzoic acid amide, N-hydroxyethylvinylbenzoic acid amide, N-phenylvinylbenzoic acid amide, N-tolylvinylbenzoic acid amide, N-(hydroxyphenyl)vinylbenzoic acid amide, N-(sulfamoylphenyl)vinylbenzoic acid amide, N-(phenylsulfonyl)vinylbenzoic acid amide, N-(tolylsulfonyl)vinylbenzoic acid amide, N,N-dimethylvinylbenzoic acid amide, N-methyl-N-phenylvinylbenzoic acid amide and N-hydroxyethyl-N-methylvinylbenzoic acid amide.

Specific examples of the alkenylcarboxylates include the following compounds:

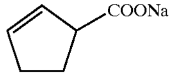
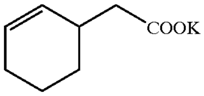
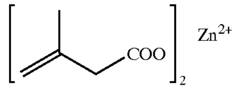
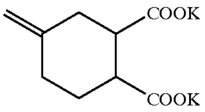
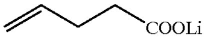
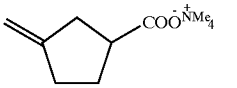
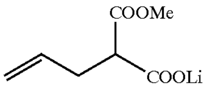
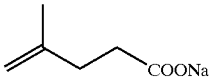
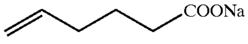

Specific examples of the alkenylcarboxylic acid esters include the following compounds:

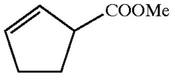
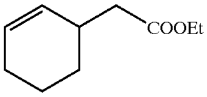
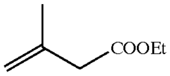
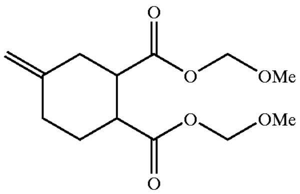
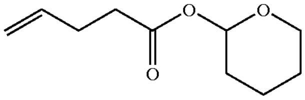
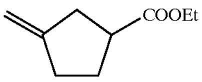

-continued

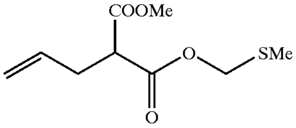

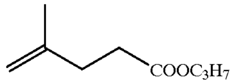

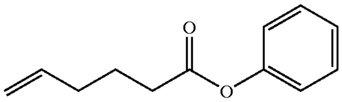

Specific examples of the alkenylcarboxylic acid amides including the following compounds:

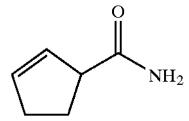

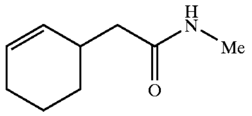

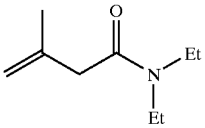

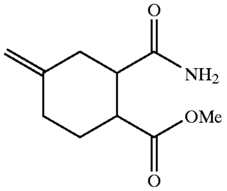

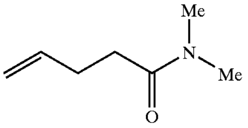

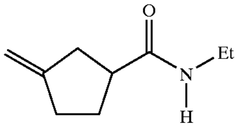

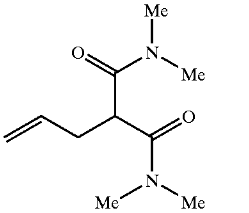

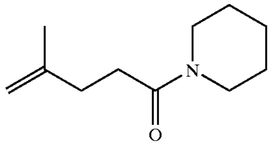

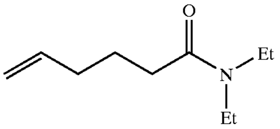

Specific examples of the alkenylcarboxylic acid imides include the following compounds:

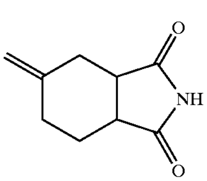

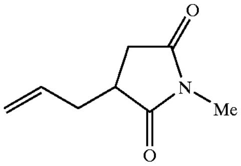

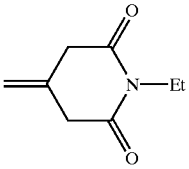

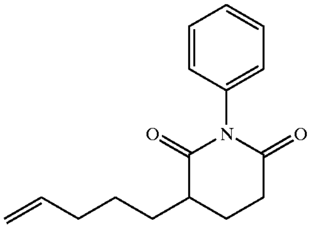

-continued

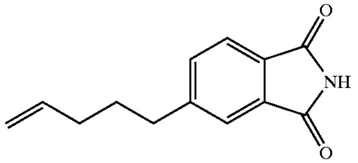

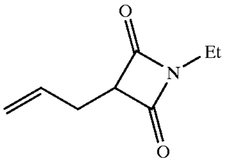

Specific examples of the alkenylcarboxylic acid anhydrides include the following compounds:

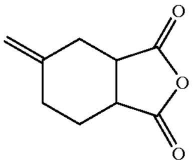

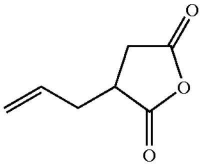

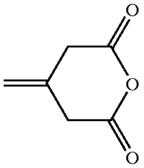

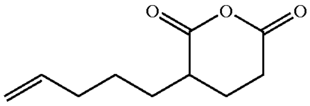

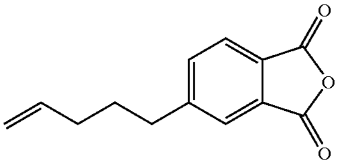

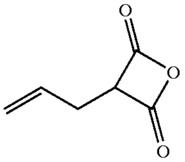

The sulfonic acid derivative-based ethylenically unsaturated compound is an ethylenically unsaturated compound having, within the molecule, at least one functional group such as a sulfonic acid group (—$SO_3H$), a sulfonate group (—$SO_3M$), a sulfonic acid ester group (—$SO_3R^1$), a sulfonic acid amide group (—$SO_2N$ ($R^2$)($R^3$)), a sulfonic acid imide group (—$SO_2N(R^2)SO_2$—) or a sulfonic acid anhydride group (—$SO_2OSO_2$—) (wherein M represents ion having a positive charge, $R^1$ represents an alkyl group, an aryl group, an alkenyl group or an alkynyl group, and $R^2$ and $R^3$ each represents hydrogen, an alkyl group, an aryl group, an alkynyl group or an alkenyl group).

When M represents ion having a positive charge, examples thereof include the above-described ions where $H^+$ is eliminated.

When $R^1$, $R^2$ and $R^3$ each represents an alkyl group, an aryl group, an alkenyl group or an alkynyl group, examples of the functional group include those described above.

Specific examples of the sulfonic acid derivative-based ethylenically unsaturated compound include the following compounds:

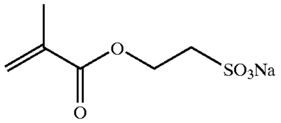

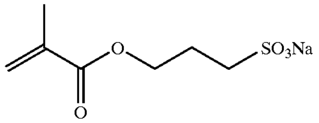

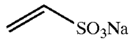

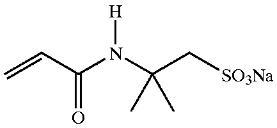

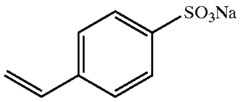

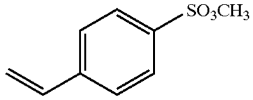

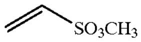

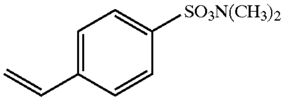

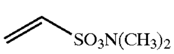

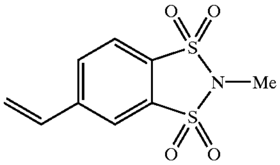

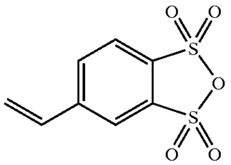

The ammonium salt-based ethylenically unsaturated compound is an ethylenically unsaturated compound having, within the molecule, at least one functional group such as an ammonium group (—N($R^1$)($R^2$)($R^3$)X), an amino group (—N($R^1$)($R^2$)), a halogen group or a sulfonyloxy group (—$OSO_2R^4$) (wherein X represents ion having a negative charge, $R^1$, $R^2$ and $R^3$ each represents hydrogen, an alkyl group, an aryl group, an alkynyl group or an alkenyl group, and $R^4$ represents an alkyl group, an aryl group, an alkenyl group or an alkynyl group). When X represents ion having a negative charge, examples thereof include the above-described ions.

When $R^1$, $R^2$, $R^3$ and $R^4$ each represents an alkyl group, an aryl group, an alkenyl group or an alkynyl group, examples of the functional group include those described above.

Specific examples of the ammonium salt-based ethylenically unsaturated compound include the following compounds:

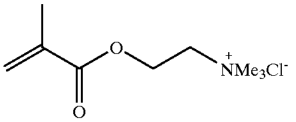

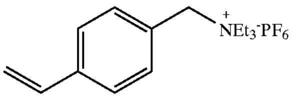

-continued

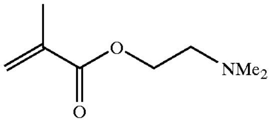

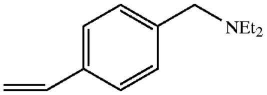

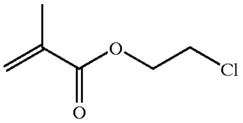

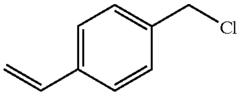

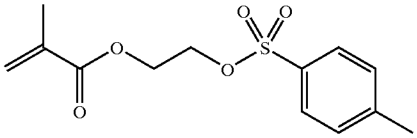

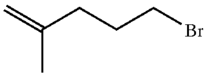

The alcohol-based ethylenically unsaturated compound is an ethylenically unsaturated compound having, within the molecule, at least one functional group such as a hydroxyl group (—OH), an acyloxy group (—$OCOR^1$), a sulfonyloxy group (—$OSO_2R^2$) or a halogen group (wherein $R^1$ and $R^2$ each represents an alkyl group, and group, an alkynyl group or an alkenyl group).

Specific examples of the alcohol-based ethylenically unsaturated compound include the following compounds:

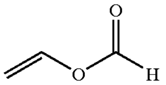

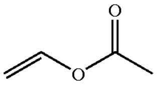

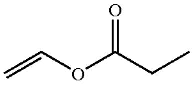

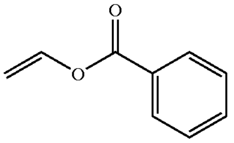

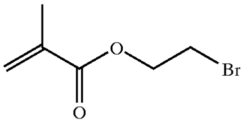

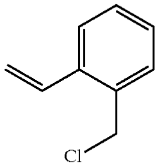

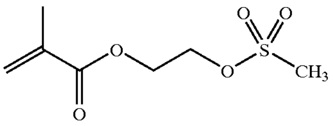

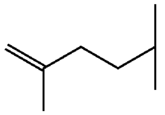

Hydrophilic Polymer A for use in the present invention may be a homopolymer of individual ethylenically unsaturated compounds described above or a copolymer of two or more of these monomers, or may be a copolymer with another copolymerizable monomer as long as it exhibits hydrophilicity required in the present invention. Examples of the another copolymerizable monomer component include known monomers such as styrenes, unsaturated hydrocarbons, α,β-unsaturated ketones.

Specific examples of the styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene and fluorostyrene.

Specific examples of the unsaturated hydrocarbons include the following compounds:

$H_2C{=}CH_2$ $H_2C{=}CHCH_3$ $HC{\equiv}HC$ $HC{\equiv}CCH_3$

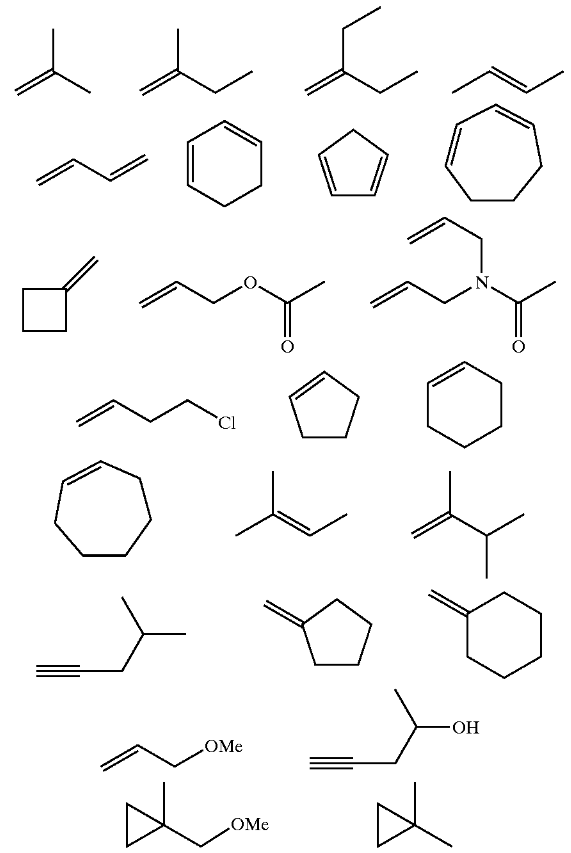

Specific examples of the α,β-unsaturated ketones include the following compounds:

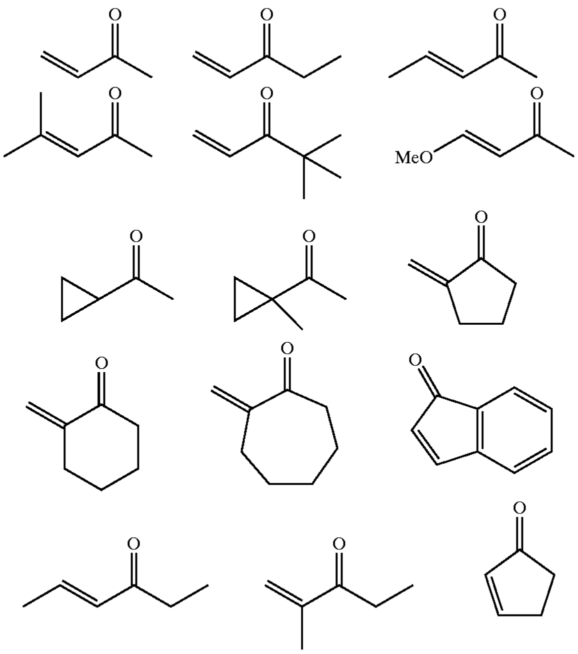

-continued

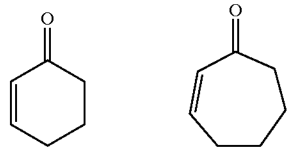

When used in combination with this another monomer, the carboxylic acid derivative-based ethylenically unsaturated compound, the sulfonic acid derivative-based ethylenically unsaturated compound, the ammonium salt-based ethylenically unsaturated compound or the alcohol-based ethylenically unsaturated compound is usually used in an amount of preferably 10 mol % or more, more preferably 40 mol % or more, based on all monomer components.

Hydrophilic Polymer A for use in the present invention can be produced using a known method described, for example, in *Kobunshi Kagaku* (*Polymer Chemistry*), Vol. 7, page 142 (1950). More specifically, Hydrophilic polymer A may be any of a random polymer, a block polymer and a graft polymer, but a random polymer is preferred. This may be synthesized by a radical polymerization using a polymerization initiator, for example, a peroxide such as di-t-butyl peroxide and benzoyl peroxide, a persulfate such as ammonium persulfate, or an azo compound such as azobisisobutyronitrile, though this may be appropriately selected according to the polymerization system. Examples of the polymerization system which can be applied include solution polymerization, emulsion polymerization and suspension polymerization. The polymerization degree of Hydrophilic Polymer A is not particularly limited.

Examples of the solvent used in the synthesis of Hydrophilic Polymer A for use in the present invention include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide and water. These solvents may be used individually or in combination of two or more thereof.

Depending on the case, Hydrophilic Polymer A is preferably subjected to a chemical reaction treatment so as to impart hydrophilicity and thereby bring out the effect of the present invention. Examples of the chemical reaction treatment include an acid-based reaction, a hydrolysis reaction, a nucleophilic substitution reaction by a hydroxide ion or an amine compound, and an alkylation reaction by an alkyl halide or an alkylsulfonic acid ester.

The acid-based reaction treatment is performed by dissolving Hydrophilic Polymer A conditioned to have a carboxyl group or a sulfonic acid group in the side chain, in water or an alcohol-based solvent such as methanol, ethanol and propanol or in a mixed solvent thereof, adding thereto an alkaline aqueous solution such as sodium hydroxide, lithium hydroxide, potassium hydroxide, calcium hydroxide and magnesium hydroxide, and stirring the resulting solution at from 0 to 80° C. for from 1 to 10 hours.

The hydrolysis reaction is performed by dissolving Hydrophilic Polymer A conditioned to have a carboxylic acid ester group, a carboxylic acid amide group, a carboxylic acid imide group, a carboxylic acid anhydride group, a sulfonic acid amide group, a sulfonic acid imide group, a sulfonic acid anhydride group or an acyloxy group in the side chain, in a mixed solvent of water and an alcohol-based solvent such as methanol, ethanol and propanol, adding thereto an alkaline aqueous solution such as sodium hydroxide, lithium hydroxide, potassium hydroxide, calcium hydroxide and magnesium hydroxide, and stirring the resulting solution at from 20 to 80° C. for from 1 minute to 10 hours.

The nucleophilic substitution reaction by a hydroxide ion or an amine compound is performed by dissolving Hydrophilic Polymer A conditioned to have a halogen atom or a sulfonyloxy group in the side chain, in a solvent such as tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide and water, or a mixed solvent thereof, adding thereto an alkaline aqueous solution such as sodium hydroxide, lithium hydroxide, potassium hydroxide, calcium hydroxide and magnesium hydroxide or adding an amine compound such as methylamine, ethylamine, propylamine, butylamine, dimethylamine, diethylamine, diisopropylamine, N-methylaniline, triethylamine and pyridine, and stirring the resulting solution at from 20 to 150° C. for from 1 to 10 hours.

The alkylation reaction by an alkyl halide or an alkylsulfonic acid ester is performed by dissolving Hydrophilic Polymer A conditioned to have an amino group in the side chain in a solvent such as tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide and water, or a mixed solvent thereof, adding thereto an alkyl halide or an alkylsulfonic acid ester, such as methyl iodide, ethyl iodide, propyl bromide, butyl chloride, methyl p-toluenesulfonate, ethyl benzenesulfonate and ethyl trifluoromethanesulfonate, and stirring the resulting solution at from 20 to 150° C. for from 1 to 15 hours.

Specific examples of Hydrophilic Polymer A for use in the present invention and the substances used for the chemical reaction treatments thereof are set forth below, however, the present invention is by no means limited thereto.

The ratio of Hydrophilic Polymer A contained in the photosensitive layer of the lithographic printing original plate of the present invention is preferably from 0 to 94 wt %, more preferably from 0.05 to 90 wt %, based on the entire solid content.

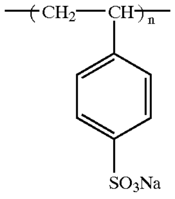

Hydrophilic Polymer (2)

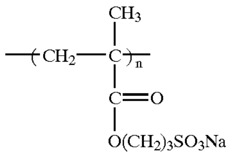

Hydrophilic Polymer (1)

-continued

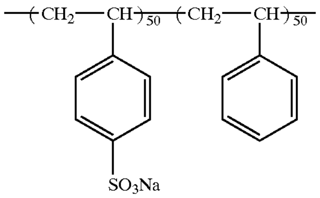

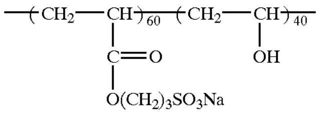

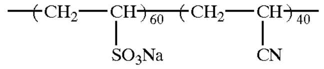

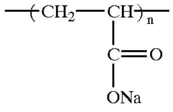

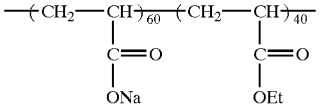

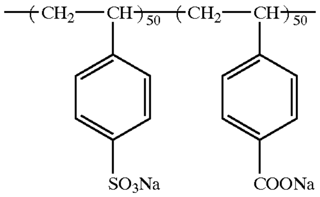

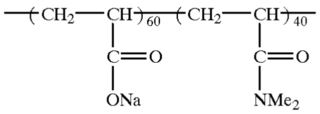

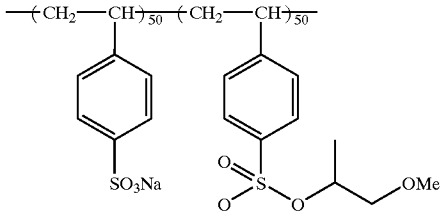

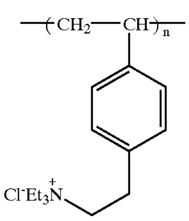

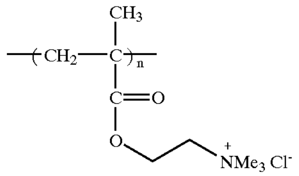

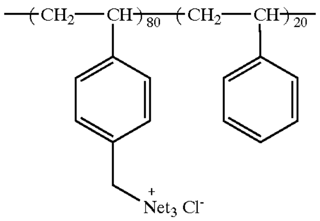

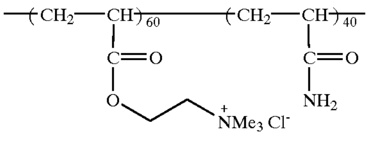

-continued

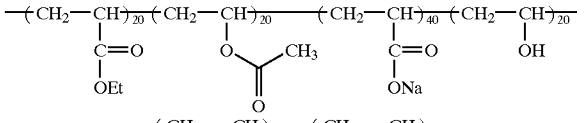

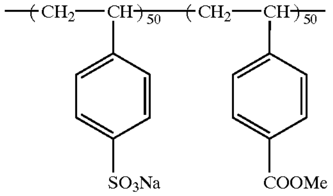

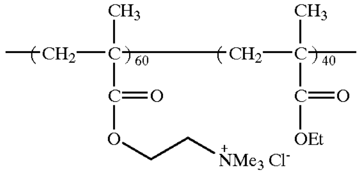

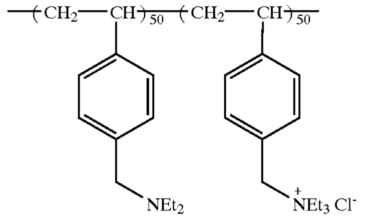

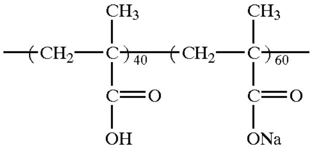

[Hydrophilic Polymer Compound which Becomes Hydrophobic by Heat]

The lithographic printing original plate of the present invention may further contain in the photosensitive layer, a hydrophilic polymer compound capable of becoming hydrophobic by heat. The photosensitive layer constructed as such is ink-repellent and at the same time, can be easily removed by water, because the infrared absorbent and the hydrophilic polymer compound both are hydrophilic before the above-described predetermined treatment is applied. After the predetermined treatment is applied, not only the infrared absorbent but also the polymer compound become hydrophobic, as a result, the photosensitive layer allows inking and also is greatly reduced in the solubility in water. Therefore, by applying the predetermined treatment to the lithographic printing original plate of the present invention to record an image thereon and then mounting it on a printing machine without passing through any processing, a printing plate of on-press development system where the area not subjected to the predetermined treatment can be removed using the fountain solution in the printing machine, can be obtained.

The hydrophilic polymer compound capable of becoming hydrophobic by heat for use in the present invention (hereinafter simply referred to as a "polarity conversion polymer compound") includes hydrophilic polymer compounds having in the side chain a hydrophilic functional group capable of becoming hydrophobic, decomposing or desorbing (i.e., releasing) by heat. This change must be on such a degree that when heat is applied due to light-heat conversion after the laser exposure, a part or all of the polarity conversion functional groups on the side chain are changed, decomposed or eliminated by heat and the polymer compound which exhibits hydrophilicity, for example, dissolves or swells at an ordinary temperature, becomes not to exhibit hydrophilicity such as dissolving in or swelling with water.

With respect to the process of the hydrophilic functional group on the side chain of the hydrophilic polymer compound becoming hydrophobic by heat, two processes may be considered. One is a process where the originally hydrophilic functional group on the side chain causes a reaction by heat and thereby becomes hydrophobic, and another is a process where the originally hydrophilic functional group on the side chain decomposes by heat to lose the hydrophilic functional group and thereby becomes hydrophobic.

As the former process of changing from hydrophilic to hydrophobic as a result of reaction caused by heat, a process where the hydrophilic functional group reacts with another functional group within the polymer due to heat and becomes hydrophobic and a process where the hydrophilic functional group reacts with another compound outside the polymer due to heat and becomes hydrophobic may be considered. The functional group may be rendered hydrophobic through a combination of these two kinds of processes.

Among the above-described processes, in view of reactivity, a process where the originally hydrophilic functional group on the side chain decomposes due to heat to lose the hydrophilic functional group, and thereby becomes hydrophobic is preferred.

In the present invention, it is preferred that all hydrophilic functional groups capable of becoming hydrophobic, decomposing or desorbing by heat (hereinafter sometimes referred to as a "polarity conversion functional group") on the side chain of the polarity conversion polymer compound are changed to be hydrophobic or are decomposed or released. However, this is not particularly limited and it may suffice if the polarity conversion polymer compound is changed not to exhibit hydrophilicity such as dissolving in water or swelling with water, but not all of the hydrophilic functional groups are necessary to become hydrophobic or be decomposed or released.

The hydrophilic functional group includes the functional groups represented by formulae (1) to (5). In particular, from the standpoint of reactivity, storage stability and discrimination between hydrophilicity and hydrophobicity, the functional group is preferably a carboxylic acid group or a carboxylate group represented by the following formula (6):

(6)

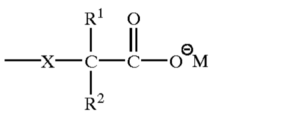

wherein X represents —O—, —S—, —Se—, '$NR^3$—, —CO—, —SO—, —$SO_2$—, —PO—, —$SiR^3R^4$— or —CS—, $R^1$, $R^2$, $R^3$ and $R^4$ each independently represents a monovalent group, and M represents ion having a positive charge.

Specific examples of $R^1$, $R^2$, $R^3$ and $R^4$ include —F, —Cl, —Br, —I, —CN, '$R^5$, —$OR^5$, —$OCOR^5$, —$OCOOR^5$, —$OCONR^5R^6$, —$OSO_2R^5$, —$COR^5$, —$COOR^5$, —CONR $R^6$, —$NR^5R^6$, —$NR^5$—$COR^6$, —$NR^5$—$COOR^6$, —$NR^5$—$CONR^6R^7$, —$SR^5$, —$SOR^5$, —$SO_2R^5$ and $SO_3R^5$.

Specific examples of $R^5$, $R^6$ and $R^7$ include hydrogen, an alkyl group, an aryl group, an alkenyl group and an alkynyl group. Specific examples of this functional group include the functional groups described above.

Among those, preferred as $R^1$, $R^2$, $R^3$ or $R^4$ are hydrogen, an alkyl group, an aryl group, an alkynyl group and an alkenyl group.

Specific examples of M include the above-described ions having a positive charge.

The polarity conversion polymer compound for use in the present invention may be a homopolymer formed of one monomer having the above-described hydrophilic functional group or a copolymer formed of two or more of the monomers. Furthermore, as long as the effect of the present invention is impaired, a copolymer with another monomer may also be used.

Specific examples of the another monomer used in the synthesis of the polarity conversion polymer compound include the above-described compounds having an ethylenically unsaturated double bond.

The ratio of the another monomer for use in the synthesis of the copolymer may be any as long as the polymer compound can change from hydrophilic to hydrophobic by heat, however, it is preferably 80 wt % or less, more preferably 50 wt % or less.

The polarity conversion polymer compound for use in the present invention can be produced using a known method described, for example, in *Kobunshi Kagaku* (*Polymer Chemistry*), Vol. 7, page 142 (1950). More specifically, the polarity conversion polymer compound may be any of a random polymer, a block polymer and a graft polymer, but a random polymer is preferred. This may be synthesized by a radical polymerization using a polymerization initiator, for example, a peroxide such as di-t-butyl peroxide and benzoyl peroxide, a persulfate such as ammonium persulfate, or an azo compound such as azobisisobutyronitrile, though this may be appropriately selected according to the polymerization system. Examples of the polymerization system which can be applied include solution polymerization, emulsion polymerization and suspension polymerization. The polymerization degree of the polarity conversion polymer compound is not particularly limited.

Examples of the solvent used in the synthesis of the polarity conversion polymer compound for use in the present invention include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide and water. These solvents may be used individually or in combination of two or more thereof.

Specific examples of the polarity conversion polymer compound for use in the present invention are set forth below, however, the present invention is by no means limited thereto.

P-1

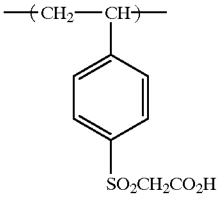

-continued

P-2

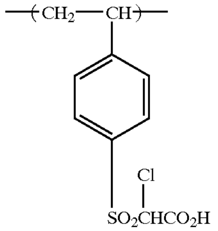

P-3

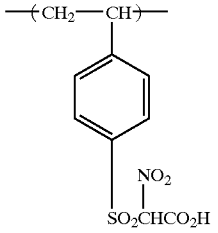

P-4

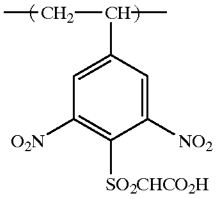

P-5

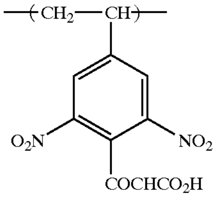

P-6

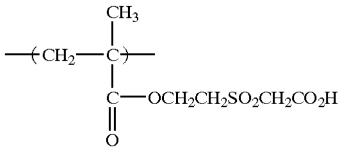

P-7

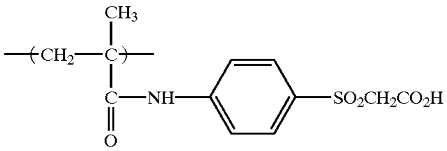

P-8

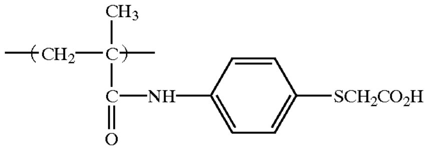

P-9

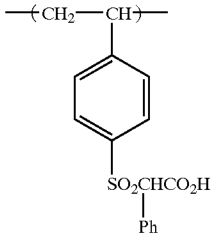

-continued
P-10
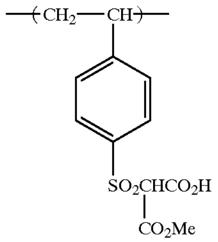
P-11
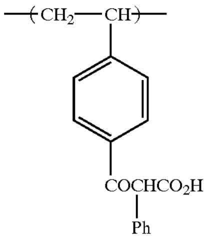
P-12
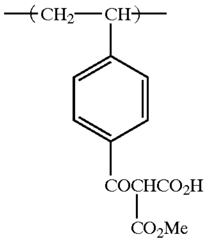
P-13
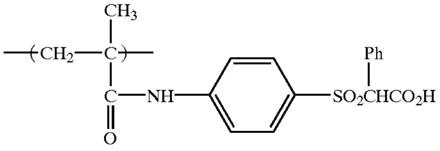
P-14
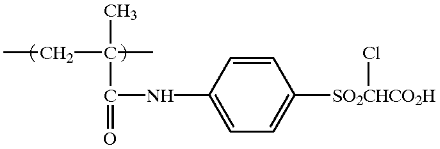
P-15
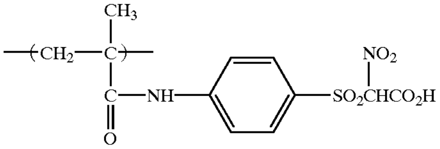
P-16
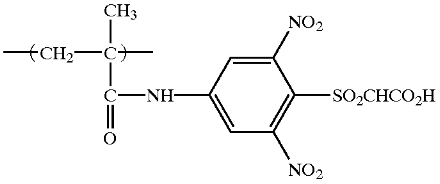
P-17
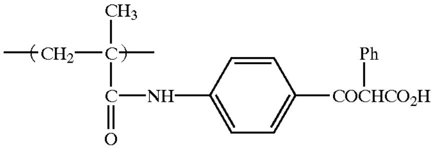
-continued
P-18
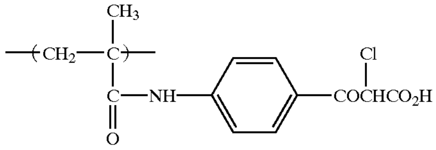
P-19
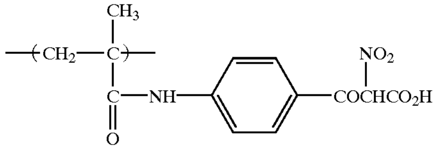
P-20
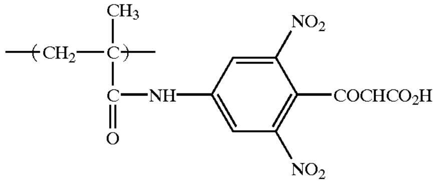
P-21
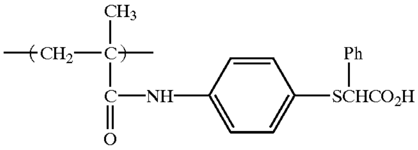
P-22
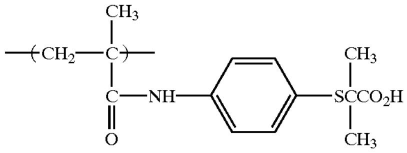
P-23
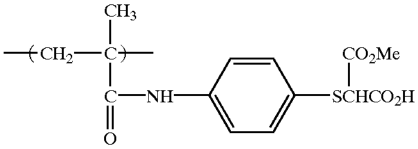
P-24
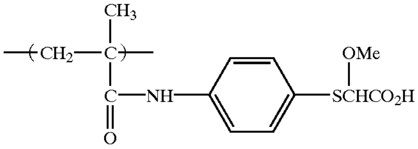
P-25
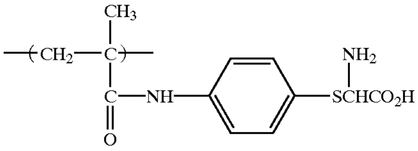
P-26
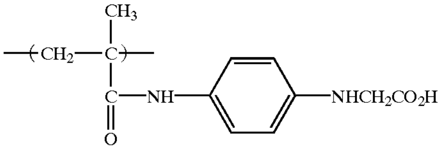

-continued
P-27
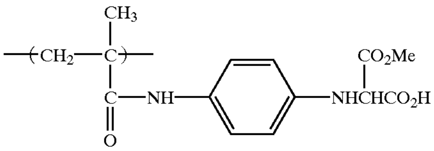
P-28
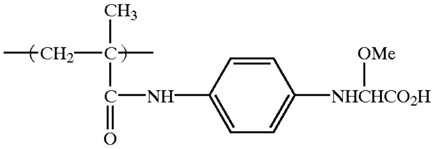
P-29
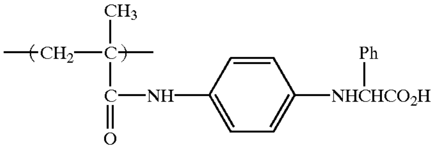
P-30
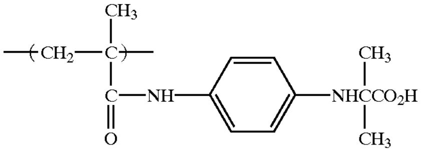
P-31
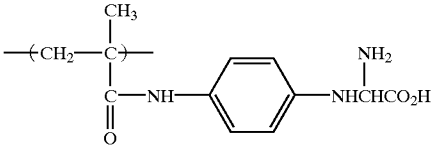
P-32
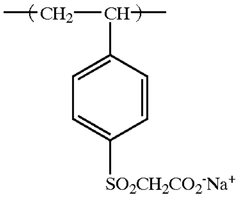
P-33
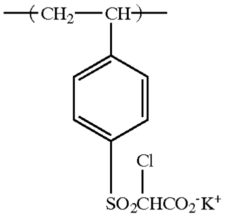
P-34
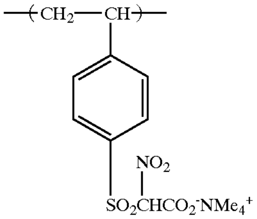
-continued
P-35
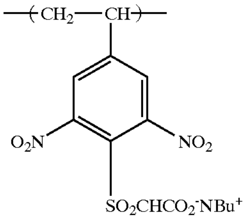
P-36
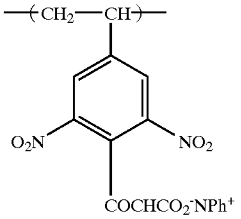
P-37
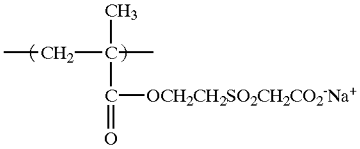
P-38
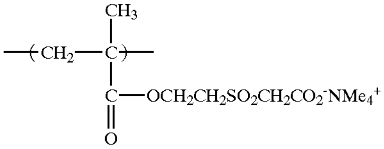
P-39
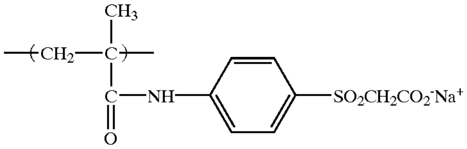
P-40
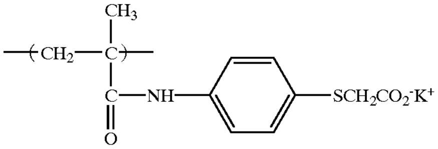
P-41
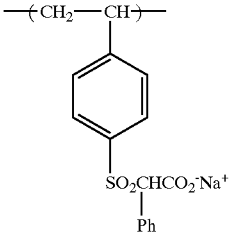
P-42
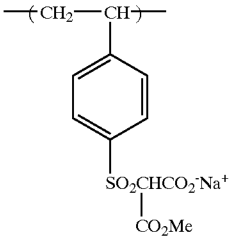

-continued
P-43
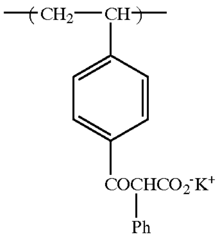
P-44
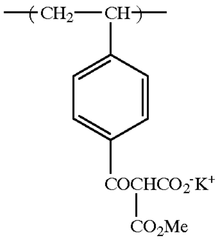
P-45
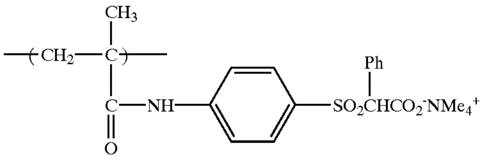
P-46
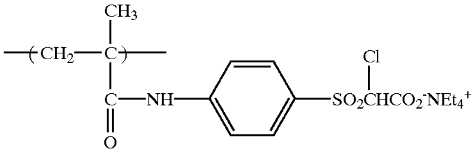
P-47
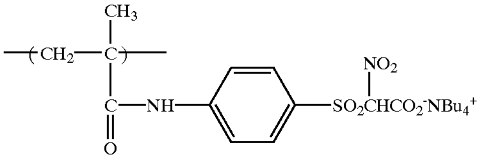
P-48
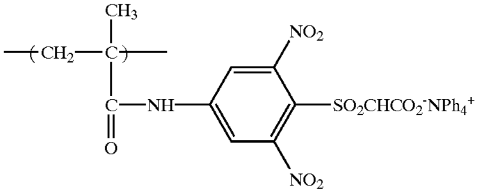
P-49
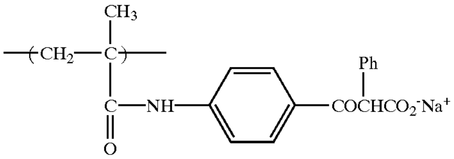
P-50
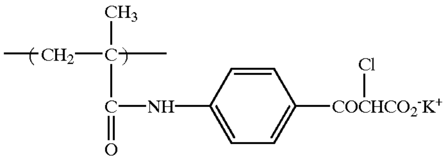
-continued
P-51
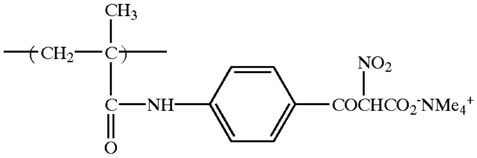
P-52
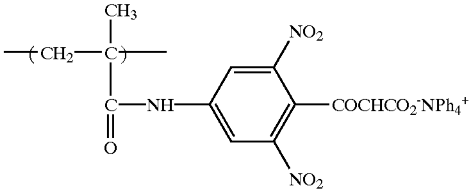
P-53
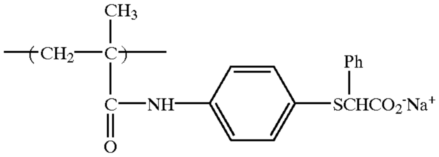
P-54
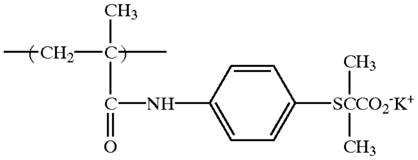
P-55
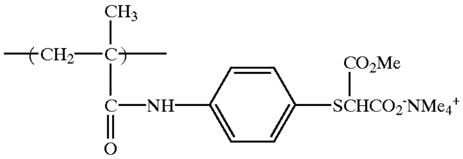
P-56
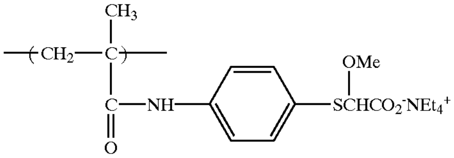
P-57
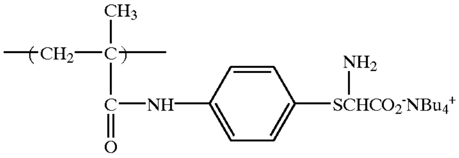
P-58
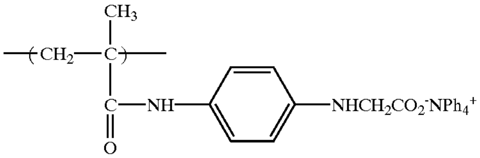
P-59
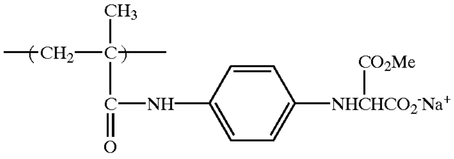

-continued

P-60

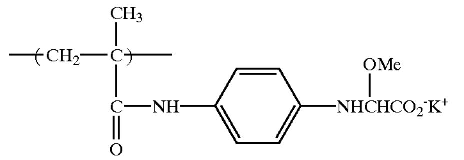

P-61

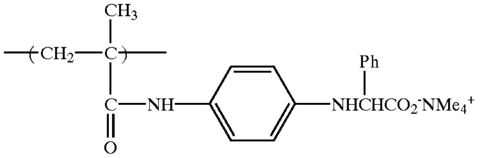

P-62

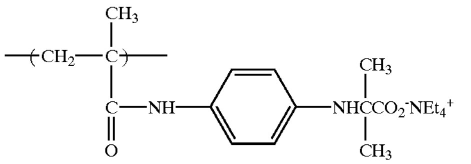

P-63

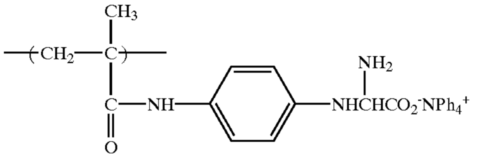

P-64

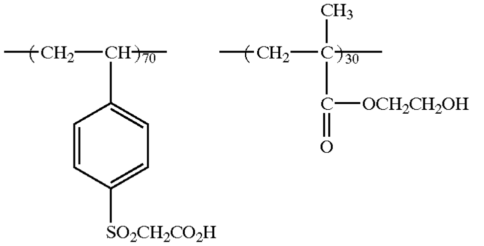

P-65

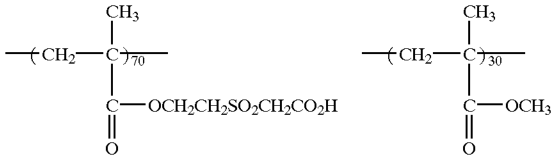

P-66

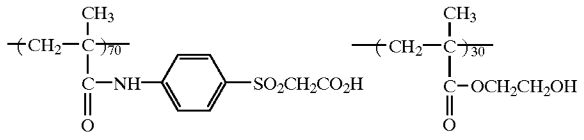

P-67

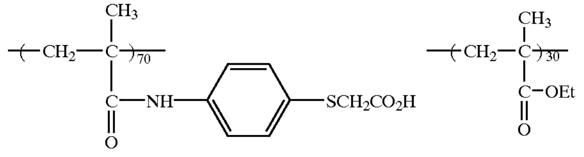

-continued

P-68

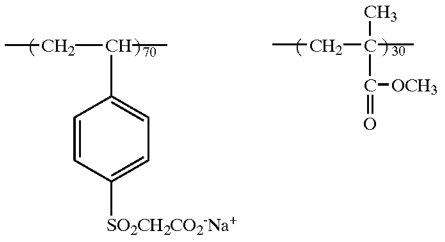

P-69

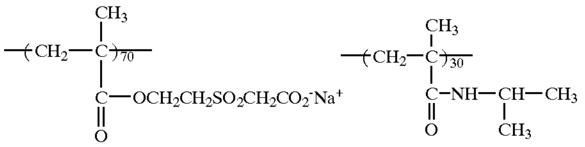

The ratio of the polarity conversion polymer compound contained in the photosensitive layer of the lithographic printing original plate of the present invention is preferably from 0 to 94 wt %, more preferably from 0.05 to 90 wt %, based on the entire solid content.

[Surface Active Agent]

The photosensitive layer of the lithographic printing original plate of the present invention may contain a nonionic surface active agent described in JP-A-62-251740 and JP-A-3-208514 or an amphoteric surface active agent described in JP-A-59-121044 and JP-A-4-13149 so as to broaden the stability to the printing conditions.

Specific examples of the nonionic surface active agent include sorbitan tristearate, sorbitan monopalmitate, sorbitan trioleate, stearic acid monoglyceride and polyoxyethylene nonylphenyl ether.

Specific examples of the amphoteric surface active agent include alkyldi(aminoethyl)glycine, alkylpolyaminoethyl glycine hydrochloride, 2-alkyl-N-carboxyethyl-N-hydroxyethylimidazolinium betaine and N-tetradecyl-N,N-betaine type (for example, AMORGEN K, trade name, produced by Daiichi Kogyo K.K.).

The ratio of nonionic surface active agent or amphoteric surface active agent contained in the photosensitive layer is preferably from 0.05 to 15 wt %, more preferably from 0.1 to 5 wt %, based on the entire solid content.

[Other Constituent Components]

If desired, the photosensitive layer of the lithographic printing original plate of the present invention may further contain a plasticizer for imparting flexibility to the coating. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

The photosensitive layer of the lithographic printing original plate of the present invention may be produced by dissolving the above-described respective components in a solvent and applying the resulting solution on an appropriate support. Examples of the solvent used here include tetrahydrofuran, ethylene dichloride, cyclohexanone, methyl ethyl ketone, acetone, methanol, ethanol, propanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, dimethoxyethane, N,N-dimethylformamide, N,N-dimethylacetamide, toluene, ethyl acetate, ethyl lactate, methyl lactate, dimethyl sulfoxide, water, sulfolane and γ-butyrolactone, however, the present invention is by no means limited thereto.

These solvents may be used either individually or in combination. In the case of preparing a coating solution, the concentration of the photosensitive layer-constituting components (all solids content including additives) in the solvent is preferably from 1 to 50 wt %.

The coating solution may be coated by various known methods such as bar coater coating, rotation coating, spray coating, curtain coating, dip coating, air knife coating, blade coating and roll coating.

The photosensitive layer of the lithographic printing original plate of the present invention may contain a surface active agent so as to improve the coatability, such as a fluorine-based surface active agent described, for example, in JP-A-62-170950. The amount of the surface active agent added is preferably from 0.01 to 1 wt %, more preferably from 0.05 to 0.5 wt %, based on the entire solid content in the polymer complex layer.

The coated amount (solid content) of the photosensitive layer obtained after the coating and drying varies depending on the use, however, in the case of a general lithographic printing original plate, it is from 0.1 to 5.0 $g/m^2$, preferably from 0.1 to 2.0 $g/m^2$, more preferably from 0.2 to 2.0 $g/m^2$.

[Support]

The support (substrate) for use in the lithographic printing original plate of the present invention is not particularly limited as long as it has a hydrophilic surface, and any known plate-like material having good dimensional stability and heretofore used as a support of printing plates may be suitably used. Examples of the support include paper, paper laminated with plastic (for example, polyethylene, polypropylene or polystyrene), metal plates such as aluminum (including aluminum alloy), zinc, iron and copper, plastic film such as cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate and polyvinyl acetal, and paper or plastic film having laminated or deposited thereon the above-described metal. Among these, an aluminum plate is preferred. The aluminum plate includes pure aluminum plate and aluminum alloy plate. As the aluminum alloy, various alloys may be used and for example, alloys of aluminum with a metal such as silicon, copper, manganese, magnesium, chromium, zinc, lead, bismuth or nickel may be used. The alloy composition is allowed to contain a negligible amount of impurities in addition to some iron and titanium.

The support is subjected to a surface treatment, if desired. For example, in the manufacture of a lithographic printing original plate, the support surface is subjected to a hydrophilization treatment in advance of the coating of the photosensitive layer on the surface of the support.

In the case of a support having a metal surface, particularly aluminum surface, the support is preferably subjected to a surface treatment such as graining, soaking in an aqueous solution of sodium silicate, potassium fluorozirconate or phosphate, or anodization. An aluminum plate subjected to graining and then to soaking in an aqueous sodium silicate solution described in U.S. Pat. No. 2,714,066, and an aluminum plate subjected to anodization and then to soaking in an aqueous alkali metal silicate solution described in U.S. Pat. No. 3,181,461 may also be suitably used. The anodization is performed by passing a current using the aluminum plate as an anode in an electrolytic solution comprising, for example, an aqueous or non-aqueous solution of an inorganic acid such as phosphoric acid, chromic acid, sulfuric acid or boric acid, an organic acid such as oxalic acid or sulfamic acid, or a salt of their acids. These aqueous or non-aqueous solutions may be used individually or in combination of two or more thereof.

The silicate electrodeposition described in U.S. Pat. No. 3,658,662 is also an effective surface treatment.

These hydrophilization treatments are performed not only to render the support surface hydrophilic but also to prevent a harmful reaction with the photosensitive layer coated thereon or to improve the adhesion to the photosensitive layer.

In advance of the surface roughening by graining of the aluminum plate, the surface may be subjected to a pretreatment, if desired, so as to remove the rolling oil on the surface or reveal the clean aluminum surface. For the removal of rolling oil and the like, a solvent such as trichlene or a surface active agent is usually used. For revealing the clean surface, a method of using an alkali etching agent such as sodium hydroxide and potassium hydroxide is widely used.

As the graining method, any of mechanical, chemical and electrochemical methods may be effectively used. The mechanical method includes ball polishing, blast polishing and brush polishing of rubbing a water dispersion slurry of abrasive such as pumice by a nylon brush. As the chemical method, a method of soaking the plate in a saturated aqueous solution of mineral acid aluminum salt described in JP-A-54-31187 is suitable. As the electrochemical method, a.c. electrolysis in an acidic electrolytic solution such as hydrochloric acid, nitric acid or a combination thereof, is preferred. Among these surface roughening methods, a surface roughening treatment using a combination of mechanical surface roughening and electrochemical surface roughening described in JP-A-55-137993 is preferred because the photosensitive layer can firmly adhere to the support.

The graining by the above-described method is preferably performed so that the aluminum plate surface can have a center line surface roughness (Ra) of from 0.3 to 1.0 μm.

The thus-grained aluminum plate is, if desired, washed with water and subjected to chemical etching.

The etching solution is usually selected from aqueous solutions of base or acid capable of dissolving aluminum. In this case, the coating formed on the etched surface must be different from the aluminum derived from the etching solution component. Preferred examples of the etching agent include, as a basic substance, sodium hydroxide, potassium hydroxide, trisodium phosphate, disodium phosphate, tripotassium phosphate and dipotassium phosphate; and as an acidic substance, sulfuric acid, persulfuric acid, phosphoric acid, hydrochloric acid and salts thereof. However, metals having low ionization tendency as compared with aluminum, such as salts of zinc, chromium, cobalt, nickel or copper, are not preferred because an unnecessary film is formed on the etching surface.

The etching agent is most preferably used such that the aluminum or alloy used dissolves at a rate of from 0.3 to 40 $g/m^2$ per the soaking time of 1 minute with the concentration and the temperature used, but may be used in excess of this.

Etching is performed by soaking the aluminum plate in the above-described etching solution or coating the etching solution on the aluminum plate, and the etching treatment is preferably performed to have an etching amount of from 0.5 to 1.0 $g/m^2$.

As the etching agent, an aqueous solution of base is preferably used because of its high etching rate. In this case, smut is generated, therefore, the plate is usually subjected to a desmutting treatment. Examples of the acid for use in the desmutting treatment include nitric acid, sulfuric acid, phosphoric acid, chromic acid, fluoric acid and borofluoric acid.

The etched aluminum plate is, if desired, subjected to water washing and anodization. The anodization may be performed by a method conventionally used in this field. To speak specifically, by passing a d.c. or a.c. current to the aluminum in an aqueous or non-aqueous solution of sulfuric acid, phosphoric acid, chromic acid, oxalic acid, sulfamic acid, benzenesulfonic acid or a combination of two or more thereof, an anodic oxide film can be formed on the aluminum support surface.

The anodization treatment conditions vary depending on the electrolytic solution used and cannot be indiscriminately specified, however, suitable conditions are generally such that the electrolytic solution concentration is from 1 to 80 wt %, the liquid temperature is from 5 to 70° C., the current density is from 0.5 to 60 $A/dm^2$, the voltage is from 1 to 100 V, and the electrolysis time is from 30 seconds to 50 minutes.

Among the anodization treatments, the method of performing anodization at a high current density in sulfuric acid described in British Patent 1,412,768 and the method of anodization using phosphoric acid as the electrolysis bath described in U.S. Pat. No. 3,511,661 are preferred.

The thus surface roughened and further anodized aluminum plate may be hydrophilized, if desired. Preferred examples of the hydrophilization method include a treatment with an alkali metal silicate such as an aqueous sodium silicate solution disclosed in U.S. Pat. Nos. 2,714,066 and 3,181,461, and a treatment with potassium fluorozirconate disclosed in JP-B-36-22063 (the term "JP-B" as used herein means an "Japanese examined patent publication") or with polyvinylphosphonic acid disclosed in U.S. Pat. No. 4,153, 461.

[Other Layers]

On the back surface of the support, a backcoat is provided, if desired. As the backcoat, a coating layer comprising an organic polymer compound described in JP-A-5-45885 or a metal oxide obtained by the hydrolysis or polycondensation of an organic or inorganic metal compound described in JP-A-6-35174 may be preferably used.

In particular, a coating layer comprising a metal oxide obtained from an alkoxy compound of silicon, such as $Si(OCH_3)_4$, $Si(OC_2H_5)_4$, $Si(OC_3H_7)_4$ and $Si(OC_4H_9)_4$, is preferred because the compound is inexpensive and easily available and the coating layer has excellent hydrophilicity.

[Plate-Making Process]

The method for manufacturing a lithographic printing plate from the lithographic printing original plate of the present invention is described below. The lithographic printing original plate is, for example, subjected to direct image recording by the imagewise heat-sensitive recording using a thermal recording head or the like or to image recording by the imagewise exposure to light.

Examples of the light source for an active ray used in the imagewise exposure include a mercury lamp, a metal halide lamp, a xenon lamp, a chemical lamp and a carbon arc lamp. Examples for a radioactive ray include an electron beam, an X ray, an ion beam and a far infrared ray. Also, g ray, i ray, Deep-UV ray and high-density energy beam (laser beam) may be used. For the laser beam, a helium-neon laser, an argon laser, a krypton laser, a helium-cadmium laser, a KrF eximer laser, a solid laser and a semiconductor laser may be used.

In the present invention, a solid laser and a semiconductor laser are preferred, which each irradiates an infrared ray at the wavelength of from 760 to 1,200 nm.

After the above-described image recording by light, irrespective of whether or not the development processing is performed, a heat treatment is preferably applied so as to improve the sensitivity at the recording. The heat treatment is preferably performed at from 80 to 160° C. for from 10 seconds to 5 minutes. By applying this heat treatment, the energy necessary for the recording can be reduced at the exposure using the above-described light source.

The lithographic printing original plate of the present invention subjected to the above-described image recording is then developed with a developer and if desired, gummed or burnt, and the resulting plate may be mounted in a printing machine and subjected to printing. The plate may also be mounted in a printing machine immediately after the image recording (without passing through the development process) and subjected to printing. In this case, the non-heated area or unexposed area swells with fountain solution or the like and the swelled area is removed at the initial stage of printing, thereby forming a lithographic printing plate. In other words, in the plate-making process using the lithographic printing original plate of the present invention, a lithographic printing plate can be manufactured without particularly passing development or other treatments.

As the developer or replenisher for the lithographic printing original plate of the present invention, a conventionally known aqueous alkali solution or pure water may be used. Examples of the alkali agent include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide. In addition, organic alkali agents such as monomethylamine, dimethylamine, trimethylamine, monoethylamine, diethylamine, triethylamine, monoisoproylamine, diisopropylamine, triisopropylamine, n-butylamine, monoethanolamine, diethanolamine, triethanolamine, monoisopropanolamine, diisopropanolamine, ethyleneimine, ethylenediamine and pyridine, may also be used.

These alkali agents may be used either individually or in combination of two or more thereof.

Among these alkali agents for use in the developer, an aqueous solution of silicate such as sodium silicate and potassium silicate is particularly preferred. This is because the developability can be controlled by the ratio of silicon oxide $SiO_2$ as a component of the silicate to a metal oxide $M_2O$. Alkali metal silicates described, for example, in JP-A-54-62004 and JP-B-57-7427 may be effectively used.

In the case of developing the plate using an automatic developing machine, it is known that by adding an aqueous solution (replenisher) having an alkali intensity higher than that of developer, a large number of PS plates can be treated without exchanging the developer in the developing tank for a long time. Also in the present invention, this replenishing system is preferably used. The developer or replenisher may contain, if desired, various surface active agents and organic solvents so as to accelerate or inhibit the development, disperse the development scum or increase the ink-receptivity in the image area of the printing plate. Preferred surface active agents include anionic, cationic, nonionic and amphoteric surface active agents.

The developer or replenisher may further contain, if desired, a reducing agent such as sodium salt or potassium salt of an inorganic acid (e.g., hydroquinone, resorcin, sulfurous acid, hydrosulfurous acid), and additionally an organic carboxylic acid, a defoaming agent and a hard water softener.

The printing plate developed using the above-described developer or replenisher is after-treated with washing water, a rinsing solution containing a surface active agent or the like, or a desensitizing solution containing gum arabi or a starch derivative. In the case where the lithographic printing original plate of the present invention is subjected to image formation and used as a printing plate, the after treatment may be performed by variously combining those treatments.

In recent years, an automatic developing machine for printing plates is widely used for rationalizing and standardizing the plate-making work in the plate-making and printing art. This automatic developing machine generally consists of a development part and an after-treatment part and comprises a printing plate conveying unit, respective processing solution tanks and a spray unit, where while horizontally conveying an exposed printing plate, each processing solution pumped up is sprayed on the plate through a spray nozzle to develop the plate. Furthermore, a method of processing the printing plate while dipping and conveying it though processing solution tanks filled with respective processing solutions by means of guide rolls provided in the solution is also known. In this automatic development, the processing may be performed while supplying the replenisher to each processing solution according to the amount processed or the operation time.

Also, a so-called disposable processing system where the plate is processed with a substantially unused processing solution, may also be applied.

The lithographic printing original plate of the present invention is thus imagewise exposed, developed, water washed and/or rinsed and/or gummed, and when an unnecessary image area (for example, film edge mark of the original film) is present on the lithographic printing plate obtained, the unnecessary image area is eliminated. This elimination is preferably performed by a method of coating an eliminating solution on the unnecessary image area, allowing the plate to stand for a predetermined time and then washing it with water, as described in JP-B-2-13293.

The thus-obtained lithographic printing plate is, if desired, coated with a desensitizing gum and then subjected to printing process. For obtaining a lithographic printing plate having a longer press life, the plate is subjected to a burning treatment.

In the case of applying a burning treatment, the lithographic printing plate is preferably treated with a surface controlling solution described in JP-B-61-2518, JP-B-55-28062 and JP-A-61-159655 before the burning treatment.

For this treatment, a method of coating the (plate) burning conditioner on the lithographic printing plate using a sponge or absorbent cotton impregnated with the solution, a method of dipping the printing plate in a vat filled with the burning conditioner and thereby coating the solution, or a method of coating the solution using an automatic coater may be used. After the coating, the amount of the burning conditioner coated is preferably rendered uniform using a squeegee or a squeegee roller. By doing so, more advantageous results can be obtained.

In general, the amount of the burning conditioner coated is suitably from 0.03 to 0.8 g/m$^2$ (dry weight).

After the coating of the burning conditioner, the lithographic printing plate is dried, if desired, and then heated to a high temperature by a burning processor (for example, a burning processor "BP-1300", available from Fuji Photo Film Co., Ltd.). At this time, the heating temperature and the heating time are preferably from 180 to 300° C. and from 1 to 20 minutes, respectively, though these may vary depending on the kind of components constituting the image.

After the burning treatment, the lithographic printing plate may be appropriately subjected to, if desired, conventional treatments such as water washing and gumming. However, in the case of using a burning conditioner containing a water-soluble polymer compound or the like, a so-called desensitization treatment such as gumming may be omitted.

The lithographic printing plate obtained through these treatments is mounted on an off-set printer or the like and used for printing a large number of sheets.

EXAMPLES

The present invention is described in greater detail below by referring to the Examples, however, the present invention should not be construed as being limited thereto.

Example 1

A 0.30 mm-thick aluminum plate (constructive material: 1050) was degreased by washing the plate with trichloroethylene, subjected to graining of the surface thereof using a nylon blush and a water suspension of 400-mesh pumice, and then thoroughly washed with water. This plate was etched by dipping it in a 25 wt % aqueous sodium hydroxide solution at 45° C. for 9 seconds, washed with water, dipped in 2% nitric acid for 20 seconds, and again washed with water. At this time, the etching amount on the grained surface was about 3 g/m$^2$. Thereafter, this plate was d.c. anodized at a current density of 15 A/dm$^2$ in 7% sulfuric acid as the electrolytic solution to form a d.c. anodic oxide film of 3 g/m$^2$, then washed with water and dried.

On the thus-treated aluminum plate, Solution [1] prepared to have the following composition was applied by rotation coating at a rotation number of 150 rpm and then dried at 80° C. for 3 minutes to obtain Lithographic Printing Original Plate [1]. After the drying, the weight was 1.0 g/m$^2$.

| Solution [1] | |
|---|---|
| Infrared Absorbent (1) | 0.90 g |
| Methanol | 12.00 g |

The obtained Lithographic Printing Original Plate [1] was exposed by an IR laser (beam diameter: 28 $\mu$m) capable of emitting an infrared ray at a wavelength of 830 nm. After the exposure, the plate was subjected to ordinary printing using a Lithron printing machine. At this time, whether or not the image area was formed in a good state on the printed matter and whether or not staining of the non-image area was generated were observed. The results are shown in Table 1. In this printing, 10,000 sheets of good printed matters were obtained.

Also, the laser scanning line area on the obtained printing plate was observed through a microscope and the line width was measured. From the values obtained, the sensitivity was estimated. The results are shown in Table 1. The line width closer to the diameter (28 $\mu$m) of the beam irradiated reveals higher sensitivity. In Lithographic Printing Original Plate [1], the line width was 28 $\mu$m and very high sensitivity was revealed.

Example 2

On an aluminum plate treated in the same manner as in Example 1, Solution [2] prepared to have the following composition was applied by rotation coating at a rotation number of 150 rpm and then dried at 80° C. for 3 minutes to obtain Lithographic Printing Original Plate [2]. After the drying, the weight was 1.2 g/$m^2$.

| Solution [2] | |
|---|---|
| Hydrophilic Polymer (1) (molecular weight: 20,000) | 0.05 g |
| Infrared Absorbent (1) | 0.90 g |
| Acetonitrile | 6.00 g |
| Water | 6.00 g |

The obtained Lithographic Printing Original Plate [2] was exposed by an IR laser (beam diameter: 28 μm) capable of emitting an infrared ray at a wavelength of 830 nm. After the exposure, the plate was subjected to a heating treatment at 110° C. for 1 minute and then ordinary printing using a Lithron printing machine. At this time, whether or not the image area was formed in a good state on the printed matter and whether or not staining of the non-image area was generated were observed. The results are shown in Table 1. In this printing, 30,000 sheets of good printed matters were obtained.

Also, similarly to Example 1, the laser scanning line area on the obtained printing plate was observed through a microscope and the line width was measured. From the values obtained, the sensitivity was estimated. The results are shown in Table 1. In Lithographic Printing Original Plate [2], the line width was 24 μm and high sensitivity was revealed.

Example 3

On PET of which surface was subjected to a corona discharge treatment, Solution [3] prepared to have the following composition was applied by rotation coating at a rotation number of 150 rpm and then dried at 80° C. for 3 minutes to obtain Lithographic Printing Original Plate [3]. After the drying, the weight was 1.2 g/$m^2$.

| Solution [3] | |
|---|---|
| Hydrophilic Polymer (2) (molecular weight: 30,000) | 0.10 g |
| Infrared Absorbent (2) | 0.90 g |
| Megafac F-177 (fluorine-based surface active agent, produced by Dai-Nippon Ink & Chemicals, Inc.) | 0.06 g |
| Acetonitrile | 6.00 g |
| Water | 6.00 g |

The obtained Lithographic Printing Original Plate [3] was exposed by an IR laser (beam diameter: 28 μm) capable of emitting an infrared ray at a wavelength of 830 nm. After the exposure, the plate was subjected to ordinary printing using a Lithron printing machine. At this time, whether or not the image area was formed in a good state on the printed matter and whether or not staining of the non-image area was generated were observed. The results are shown in Table 1.

Also, similarly to Example 1, the laser scanning line area on the obtained printing plate was observed through a microscope and the line width was measured. From the values obtained, the sensitivity was estimated. The results are shown in Table 1. In Lithographic Printing Original Plate [3], the line width was 26 μm and high sensitivity was revealed.

Example 4

On an aluminum plate treated in the same manner as in Example 1, Solution [4] prepared to have the following composition was applied by a rod bar #14 and then dried at 80° C. for 3 minutes to obtain Lithographic Printing Original Plate [4]. After the drying, the weight was 1.5 g/$m^2$.

| Solution [4] | |
|---|---|
| Polarity conversion polymer compound (P-7, molecular weight: 35,000) | 0.50 g |
| Infrared Absorbent (1) | 0.50 g |
| Methanol | 14.00 g |

The obtained Lithographic Printing Original Plate [4] was exposed by an IR laser (beam diameter: 28 μm) capable of emitting an infrared ray at a wavelength of 830 nm. After the exposure, the plate was subjected to a heat treatment at 110° C. for 1 minute and then ordinary printing using a Lithron printing machine. At this time, whether or not the image area was formed in a good state on the printed matter and whether or not staining of the non-image area was generated were observed. The results are shown in Table 1. In this printing, 30,000 sheets of good printed matters were obtained.

Also, similarly to Example 1, the laser scanning line area on the obtained printing plate was observed through a microscope and the line width was measured. From the values obtained, the sensitivity was estimated. The results are shown in Table 1. In Lithographic Printing Original Plate [4], the line width was 26 μm and high sensitivity was revealed.

Example 5

On an aluminum plate treated in the same manner as in Example 1, Solution [5] prepared to have the following composition was applied by rotation coating at a rotation number of 150 rpm and then dried at 80° C. for 3 minutes to obtain Lithographic Printing Original Plate [5]. After the drying, the weight was 1.1 g/$m^2$.

| Solution [5] | |
|---|---|
| Polarity conversion polymer compound (P-32, molecular weight: 35,000) | 0.80 g |
| Infrared Absorbent (3) | 0.20 g |
| Dye where the counter ion of Victoria Pure Blue BOH was 1-naphthalene-sulfonic acid) | 0.05 g |
| Megafac F-177 (fluorine-based surface active agent, produced by Dai-Nippon Ink & Chemicals, Inc.) | 0.06 g |
| Methanol | 7.00 g |
| Water | 7.00 g |

The obtained Lithographic Printing Original Plate [5] was exposed by an IR laser (beam diameter: 28 μm) capable of emitting an infrared ray at a wavelength of 830 nm. After the exposure, the plate was subjected to a heat treatment at 110° C. for 1 minute and then ordinary printing using a Lithron printing machine. At this time, whether or not the image area was formed in a good state on the printed matter and whether or not staining of the non-image area was generated were observed. The results are shown in Table 1.

Also, similarly to Example 1, the laser scanning line area on the obtained printing plate was observed through a microscope and the line width was measured. From the values obtained, the sensitivity was estimated. The results are shown in Table 1. In Lithographic Printing Original Plate [5], the line width was 24 μm and high sensitivity was revealed.

Comparative Example 1

Lithographic Printing Original Plate [6] was manufactured in the same manner as in Example 1 except for using Infrared Absorbent (4) in place of Infrared Absorbent (1).

The obtained Lithographic Printing Original Plate [6] was exposed by an IR laser (beam diameter: 28 μm) capable of emitting an infrared ray at a wavelength of 830 nm. After the exposure, the plate was subjected to ordinary printing using a Lithron printing machine. At this time, whether or not the image area was formed in a good state on the printed matter and whether or not staining of the non-image area was generated were observed. The results are shown in Table 1. In this printing, a good printed matter was not obtained at all.

Comparative Example 2

Lithographic Printing Original Plate [7] was manufactured in the same manner as in Example 4 except for using Infrared Absorbent (4) in place of Infrared Absorbent (1).

The obtained Lithographic Printing Original Plate [7] was exposed by an IR laser (beam diameter: 28 μm) capable of emitting an infrared ray at a wavelength of 830 nm. After the exposure, the plate was subjected to ordinary printing using a Lithron printing machine. At this time, whether or not the image area was formed in a good state on the printed matter and whether or not staining of the non-image area was generated were observed. The results are shown in Table 1. In this printing, 10,000 sheets of good printed matters were obtained.

Also, similarly to Example 1, the laser scanning line area on the obtained printing plate was observed through a microscope and the line width was measured. From the values obtained, the sensitivity was estimated. The results are shown in Table 1. In Lithographic Printing Original Plate [7], the line width was 25 μm and the sensitivity was good.

Comparative Example 3

On an aluminum plate treated in the same manner as in Example 1, Solution [8] prepared to have the following composition was applied by a rod bar #14 and then dried at 80° C. for 3 minutes to obtain Lithographic Printing Original Plate [8]. After the drying, the weight was 1.5 g/m$^2$.

| Solution [8] | |
|---|---|
| Polarity conversion polymer compound (P-7, molecular weight: 35,000) | 0.90 g |
| Infrared Absorbent (4) | 0.10 g |
| Methanol | 14.00 g |

The obtained Lithographic Printing Original Plate [8] was exposed by an IR laser (beam diameter: 28 μm) capable of emitting an infrared ray at a wavelength of 830 nm. After the exposure, the plate was subjected to a heat treatment at 110° C. for 1 minute and then ordinary printing using a Lithron printing machine. At this time, whether or not the image area was formed in a good state on the printed matter and whether or not staining of the non-image area was generated were observed. The results are shown in Table 1. In this printing, 5,000 sheets of good printed matters were obtained.

Also, similarly to Example 1, the laser scanning line area on the obtained printing plate was observed through a microscope and the line width was measured. From the values obtained, the sensitivity was estimated. The results are shown in Table 1. In Lithographic Printing Original Plate [8], the line width was 18 μm and the sensitivity was low.

Comparative Example 4

Lithographic Printing Original Plate [9] was manufactured in the same manner as in Example 4 except for increasing the amount of Polarity Conversion Polymer Compound (P-7) from 0.50 g to 0.95 g and decreasing the amount of Infrared Absorbent (1) from 0.50 g to 0.05 g.

The obtained Lithographic Printing Original Plate [9] was exposed by an IR laser (beam diameter: 28 μm) capable of emitting an infrared ray at a wavelength of 830 nm. After the exposure, the plate was subjected to ordinary printing using a Lithron printing machine. At this time, whether or not the image area was formed in a good state on the printed matter and whether or not staining of the non-image area was generated were observed. The results are shown in Table 1.

Also, similarly to Example 1, the laser scanning line area on the obtained printing plate was observed through a microscope and the line width was measured. From the values obtained, the sensitivity was estimated. The results are shown in Table 1. In Lithographic Printing Original Plate [9], the line width was 20 μm and the sensitivity was low.

TABLE 1

| | Lithographic Printing Original Plate | Thinning of Image Area | Staining of Non Image Area | Sensitivity (μm) |
|---|---|---|---|---|
| Example 1 | [1] | none | none | 28 |
| Example 2 | [2] | none | none | 24 |
| Example 3 | [3] | none | none | 26 |
| Example 4 | [4] | none | none | 26 |
| Example 5 | [5] | none | none | 24 |
| Comparative Example 1 | [6] | incapable of forming an image | incapable of forrning an image | incapable of forming an image |
| Comparative Example 2 | [7] thinned | slightly | stained | 25 |
| Comparative Example 3 | [8] | thinned | none | 18 |
| Comparative Example 4 | [9] | none | none | 20 |

As is apparent from Table 1, the lithographic printing original plates of the present invention were satisfied in respective results, namely, the sensitivity was high, the image area was free of thinning, and the staining was not generated. On the other hand, the lithographic printing original plates of Comparative Examples showed an unsatisfactory result in some of the properties.

As described in the foregoing pages, the lithographic printing original plate of the present invention contains in the photosensitive layer thereof 6 wt % of more of an infrared absorbent capable of changing from hydrophilic to hydrophobic by heat, so that a printing plate can be manufactured directly by an infrared laser based on the digital data of a computer or the like and effects can be provided that the sensitivity is high, the image area is free of thinning, and the staining is not generated.

While the invention has been described in detail and with reference to specific embodiments thereof, it will be apparent to one skilled in the art that various changes and modifications can be made therein without departing from the spirit and scope thereof.

What is claimed is:

1. A lithographic printing plate precursor comprising a support with a hydrophilic surface having thereon a photosensitive layer containing 6 wt % or more of an infrared absorbent which changes from hydrophilic to hydrophobic by heat and containing a hydrophilic polymer compound having a functional group represented by formula (6), wherein the photosensitive layer is capable of being dissolved and developed by water or an aqueous solution:

(6)

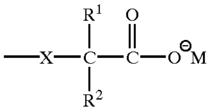

wherein X represents —O', —S—, —Se', —$NR^3$—, —CO—, —SO—, $SO_2$—, —PO—, —$SiR^3R^4$— or —CS—, $R^1$, $R^2$, $R^3$ and $R^4$ each independently represents a monovalent group, and M represents ion having a positive charge.

2. The lithographic printing plate precursor as in claim 1, wherein the infrared absorbent has a hydrophilic functional group capable of decomposing or desorbing by heat which is selected from the hydrophilic functional groups represented by formulae (1) to (5):

(1)

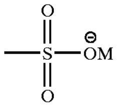

-continued (2)

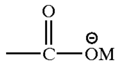

(3)

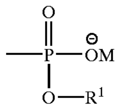

(4)

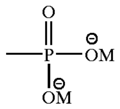

(5)

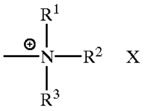

wherein M represents ion having a positive charge, X represents ion having a negative charge, and $R^1$, $R^2$ and $R^3$ each represents hydrogen, an alkyl group, an aryl group, an alkenyl group or an alkynyl group.

3. The lithographic printing plate precursor as in claim 1, wherein the photosensitive layer contains 10 wt % or more of the infrared absorbent which changes from hydrophilic to hydrophobic by heat.

* * * * *